US012224269B2

United States Patent
Chikhaoui et al.

(10) Patent No.: US 12,224,269 B2
(45) Date of Patent: Feb. 11, 2025

(54) OPTOELECTRONIC DEVICE IN WHICH THE PIXELS CONTAIN LIGHT-EMITTING DIODES THAT EMIT SEVERAL COLORS AND MANUFACTURING METHOD

(71) Applicant: ALEDIA, Échirolles (FR)

(72) Inventors: Walf Chikhaoui, Voiron (FR); Vishnuvarthan Kumaresan, Voiron (FR); Philippe Gilet, Teche (FR)

(73) Assignee: ALEDIA, Echirolles (FR)

( * ) Notice: Subject to any disclaimer, the term of this patent is extended or adjusted under 35 U.S.C. 154(b) by 423 days.

(21) Appl. No.: 17/627,464

(22) PCT Filed: Jun. 26, 2020

(86) PCT No.: PCT/FR2020/051119
§ 371 (c)(1),
(2) Date: Jan. 14, 2022

(87) PCT Pub. No.: WO2021/009426
PCT Pub. Date: Jan. 21, 2021

(65) Prior Publication Data
US 2022/0278081 A1    Sep. 1, 2022

(30) Foreign Application Priority Data

Jul. 15, 2019    (FR) ..................... 19/07920

(51) Int. Cl.
*H01L 25/075*    (2006.01)
*H01L 33/18*    (2010.01)

(52) U.S. Cl.
CPC .......... *H01L 25/0753* (2013.01); *H01L 33/18* (2013.01)

(58) Field of Classification Search
CPC ..... H01L 25/0753; H01L 33/18; H01L 33/16; H01L 33/24; H01L 27/15
See application file for complete search history.

(56) References Cited

U.S. PATENT DOCUMENTS

| 2002/0171091 A1* | 11/2002 | Goetz ................... B82Y 20/00 438/47 |
| 2016/0064608 A1 | 3/2016 | Chung et al. |

(Continued)

FOREIGN PATENT DOCUMENTS

| FR | 3031238 A1 | 7/2016 |
| FR | 3053530 A1 | 1/2018 |

(Continued)

OTHER PUBLICATIONS

International Search Report issued Oct. 7, 2020 re: Application No. PCT/FR2020/051119, pp. 1-2, citing: FR 3031238 A1, US 2016064608 A1 and US 2016072007 A1.

(Continued)

*Primary Examiner* — Karen Kusumakar
*Assistant Examiner* — Shawn Shaw Muslim
(74) *Attorney, Agent, or Firm* — CANTOR COLBURN LLP

(57) ABSTRACT

An optoelectronic device includes pixels that each have at least one primary sub-pixel having a primary light-emitting diode formed on a support face a substrate provided with a first primary semiconductive portion that has an overall elongated wire-like shape having a top end, a primary lattice parameter accommodation layer arranged on the top end of the first primary semiconductive portion, a second primary active semiconductive portion arranged at least on the primary lattice parameter accommodation layer, and a third primary semiconductive portion arranged on the second primary active semiconductive portion. The primary lattice parameter accommodation layer has, with the second primary active semiconductive portion, a first difference in primary lattice parameters between 2.12% and 0.93% relative to the second primary active semiconductive portion.

25 Claims, 5 Drawing Sheets

(56) References Cited

U.S. PATENT DOCUMENTS

2016/0072007 A1    3/2016  Choi et al.
2017/0323925 A1*  11/2017  Schneider, Jr. ....... H01L 27/156

FOREIGN PATENT DOCUMENTS

JP    2009170921 A    7/2009
WO      0016411 A1    3/2000

OTHER PUBLICATIONS

Liu Ming-Gang et al. "Influences of stress on the properties of GaN/InGaN multiple quantum well LEDs grown in Si (111) substrates", Chinese Physical Society and IOP Publishing Ltd, 2015, Vo. 24, No. 6, pp. 068503-1-068503-7, http://cpb.iphy.ac.cn.
Wei-Chih Lai, et al., "InGaN—AlInGaN Multiquantum-Well LEDs", IEEE Photonics Technology Letters, Jun. 2001, vol. 13, No. 6, pp. 559-561.

* cited by examiner

OPTOELECTRONIC DEVICE IN WHICH THE PIXELS CONTAIN LIGHT-EMITTING DIODES THAT EMIT SEVERAL COLORS AND MANUFACTURING METHOD

TECHNICAL FIELD

The present disclosure concerns an optoelectronic device comprising a plurality of pixels each including at least one primary sub-pixel comprising at least one primary light-emitting diode adapted to emit a first light radiation substantially having a first wavelength and formed on a support face of a substrate.

The disclosure also concerns a method for manufacturing an optoelectronic device comprising a plurality of pixels, in which the formation of said plurality of pixels comprises the implementation of a first phase consisting, for each pixel, in forming at least one primary sub-pixel comprising at least one primary light-emitting diode adapted to emit a first light radiation substantially having a first wavelength and formed on a support face of a substrate.

The disclosure finds application in particular in display screens or images projection systems.

BACKGROUND

By «optoelectronic device» is meant here a device adapted to perform the conversion of an electrical signal into an electromagnetic radiation to be emitted, in particular light.

There are optoelectronic devices including light-emitting diodes, also known under the acronym LED, formed on a support face of a substrate.

It is known that each light-emitting diode comprises an active material which may or may not exploit quantum wells, a semiconductor portion doped according to a first doping type to serve as a P-doped junction and a semiconductor portion doped according to a second doping type to serve as a N-doped junction.

Each light-emitting diode may be made based on micrometric or even nanometric semiconductor wired three-dimensional elements, in turn, at least partially obtained by growth by epitaxy or by organometallic vapor deposition (MOCVD) or by plasma-assisted deposition (PECVD). Typically, the light-emitting diodes are made based on a semiconductor material comprising elements from the column III and from the column V of the periodic table, such as a III-V compound, in particular gallium nitride (GaN), indium and gallium nitride (InGaN) or aluminum and gallium nitride (AlGaN).

The architecture of three-dimensional light-emitting diodes can be of the «core-shell» type with a first semiconductor portion doped according to a first doping type and of a wired shape, an active semiconductor portion covering this first part and a second semiconductor portion doped according to a second doping type and covering the active portion. The first portion is considered to be the «core» and the active portion and the second doped portion form the «shell» since they surround the first portion.

A second known architecture is called an «axial structure». In this architecture, the first semiconductor portion doped according to a first doping type, the active portion and the second semiconductor portion doped according to a second doping type are stacked in whole or in part along the longitudinal axis of the light-emitting diode.

There are optoelectronic devices including an array of light-emitting diode having a certain emission surface through which the light radiation emitted by the light-emitting diodes is transmitted. Such optoelectronic devices can in particular be used in the constitution of display screens or images projection systems, where the array of light-emitting diodes in fact defines an array of luminous pixels where each pixel traditionally includes at least one sub-pixel to generate each color, the sub-pixel itself containing at least one light-emitting diode. A given sub-pixel can for example contain up to 100,000 light-emitting diodes. In order to form an image, the optoelectronic device can be organized into independent pixels.

In particular, each pixel conventionally comprises:
at least one sub-pixel formed by at least one light-emitting diode adapted to directly generate, or to transmit blue light through an appropriate light converter,
at least one sub-pixel formed by at least one light-emitting diode adapted to directly generate, or to transmit green light through an appropriate light converter,
at least one sub-pixel formed by at least one light-emitting diode adapted to directly generate, or to transmit red light through an appropriate light converter.

A first known solution consists in providing for each pixel comprising at least one light-emitting diode adapted to emit blue light, at least one light-emitting diode adapted to emit green light and at least one light-emitting diode adapted to emit red light. To achieve that, the light-emitting diodes that are adapted to emit light in a given color are manufactured on the same substrate, that being repeated separately for the three colors. Then each substrate is cut in order to delimit individual devices.

Each pixel is then obtained by mechanical rebuilding in order to associate such individual devices so as to have the three colors.

This solution, also known under the name of «pick and place», is not optimal as it involves many manipulations, a long manufacturing time and high costs, as well as a considerable number of connections. Unfortunately, given the increasing miniaturization, this solution could sometimes turn out to be impossible to implement.

Another solution consists in providing for the light-emitting diodes being adapted to emit light in blue colors. For the light pixel to be able to emit in green colors and/or in red colors, the latter may include photoluminescent pads serving as a color converter. These photoluminescent pads are usually formed by a suitable binder matrix.

Nonetheless, this solution does not give full satisfaction because the photoluminescent pads induce high light losses. In general, the conversion rate of the pads is actually comprised between 50% and 80%. In addition, it remains complex and quite expensive to implement because of the operations dedicated to the manufacture of the photoluminescent pads.

One difficulty is to achieve that each pixel could directly generate lights of different colors, in particular blue, green and red and that in particular from materials such as GaN, InGaN or AlGaN which do not require a changing the formation technique from one sub-pixel to another and from one pixel to another.

Another major difficulty is that the diameter of the light-emitting diodes influences the color of the light radiation emitted therefrom. Conventionally, a light-emitting diode emitting red or green light will generally have a larger diameter than a light-emitting diode emitting blue light. Taking into account the increasing miniaturization of optoelectronic devices, it becomes necessary to obtain light-emitting diodes in the range of a hundred nanometers in diameter. Yet, it becomes extremely expensive, in particular during the lithography steps to define the location of the light-emitting diodes, to obtain patterns having dimensions in the range of a hundred nanometers.

Another difficulty is that light-emitting diodes of low diameter have significant structural defects at their top end, in particular due to atomic lattice misfits.

The light intensity emitted by the light-emitting wired light-emitting diodes also drastically decreases as the size of the wired light-emitting diodes is reduced.

SUMMARY

The present disclosure addresses all or part of the problems set out hereinbefore.

In particular, the disclosure provides a solution addressing at least one of the following objectives:
- guarantee that each pixel directly emits two or even three different colors, without resorting to a «pick and place» technique;
- be simple and economical to manufacture;
- guarantee that the sub-pixels emitting different colors can be manufactured with a same technique and without mechanical manipulation;
- guarantee a high light extraction from each of the light-emitting diodes;
- eliminate the need for color converters;
- avoid the use of light-emitting diodes having a very small diameter;
- allow the use of light-emitting diodes all having a substantially similar diameter from one sub-pixel to another.

This advantage can be achieved by providing an optoelectronic device comprising a plurality of pixels each including at least one primary sub-pixel comprising at least one primary light-emitting diode adapted to emit a first light radiation having substantially a first wavelength and formed on a support face of a substrate, each primary light-emitting diode comprising:
- at least one first primary semiconductor portion electrically connected to a first electrode and doped according to a first doping type selected among N-type doping and P-type doping, the first primary semiconductor portion having a generally wired shape elongated along a longitudinal axis A extending in a first direction generally perpendicular to the support face of the substrate, the first primary semiconductor portion including a top end opposite to a proximal end of the first primary semiconductor portion facing towards the support face of the substrate,
- at least one primary lattice parameter accommodation layer arranged at least on, and in contact with, the top end of the first primary semiconductor portion,
- a second primary active semiconductor portion formed by epitaxial growth from the primary lattice parameter accommodation layer, the second primary active semiconductor portion being arranged at least on, and in contact with, the primary lattice parameter accommodation layer,
- a third primary semiconductor portion electrically connected to a second electrode and doped according to a second doping type opposite to the first doping type and arranged at least on, and in contact with, the second primary active semiconductor portion,
in which the second primary active semiconductor portion is configured so as to emit said first light radiation when at least one of the first and second electrodes is powered, and in which the primary lattice parameter accommodation layer has, at least at its interface with the second primary active semiconductor portion, a first difference in primary lattice parameters comprised between 2.12% and 0.93% relative to the second primary active semiconductor portion.

Some preferred, yet non-limiting, aspects of the optoelectronic device are as follows.

In one implementation of the optoelectronic device, the primary lattice parameter accommodation layer has, at least at its interface with the first primary semiconductor portion, a second difference in primary lattice parameters comprised between 1.07% and 2.17% relative to the first primary semiconductor portion.

In one implementation of the optoelectronic device, the primary lattice parameter accommodation layer includes at least one lattice parameter accommodation primary sub-layer of a first nature configured such that the first light radiation capable of being emitted by the second primary active semiconductor portion formed on, and in contact with, said lattice parameter accommodation primary sub-layer of a first nature is generally blue-colored by consisting of light rays having essentially wavelengths comprised between a first minimum value equal to 440 nm and a first maximum value equal to 500 nm.

In one implementation of the optoelectronic device, the lattice parameter accommodation primary sub-layer of a first nature has, at least at its interface with the first primary semiconductor portion, a third difference in primary lattice parameters comprised between 1.07% and 0.65% relative to the lattice parameters of the first primary semiconductor portion.

In one implementation of the optoelectronic device, the lattice parameter accommodation primary sub-layer of a first nature contains a first alloy of aluminum, gallium, indium and nitrogen, in particular containing a gallium proportion decreasing in the first direction and in a direction opposite to the top end of the first primary semiconductor portion.

In one implementation of the optoelectronic device, the primary lattice parameter accommodation layer includes at least one lattice parameter accommodation primary sub-layer of a second nature configured so that the first light radiation capable of being emitted by the second primary active semiconductor portion formed on, and in contact with, said lattice parameter accommodation primary sub-layer of a second nature is generally green-colored by consisting of light rays having essentially wavelengths comprised between a second minimum value equal to 500 nm and a second maximum value equal to 570 nm.

In one implementation of the optoelectronic device, the lattice parameter accommodation primary sub-layer of a second nature is arranged at least on, and in contact with, the lattice parameter accommodation primary sub-layer of a first nature and in which the lattice parameter accommodation primary sub-layer of a second nature has, at least at its interface with the lattice parameter accommodation primary sub-layer of a first nature, a fourth difference in primary lattice parameters comprised between 1.71% and 3.22% relative to the lattice parameters of the lattice parameter accommodation primary sub-layer of a first nature.

In one implementation of the optoelectronic device, the lattice parameter accommodation primary sub-layer of a second nature contains a second alloy of gallium, indium and nitrogen, in particular containing an indium proportion decreasing in the first direction and in the direction opposite to the top end of the first primary semiconductor portion.

In one implementation of the optoelectronic device, the primary lattice parameter accommodation layer includes at least one lattice parameter accommodation primary sub-layer of a third nature configured so that the first light radiation capable of being emitted by the second primary active semiconductor portion formed on, and in contact with, said lattice parameter accommodation primary sub-layer of a third nature is generally red-colored by consisting of light rays having essentially wavelengths comprised between a third minimum value equal to 570 nm and a third maximum value equal to 680 nm.

In one implementation of the optoelectronic device, the lattice parameter accommodation primary sub-layer of a third nature is arranged at least on, and in contact with, the lattice parameter accommodation primary sub-layer of a second nature and in which the lattice parameter accommodation primary sub-layer of a third nature has, at least at its interface with the lattice parameter accommodation primary sub-layer of a second nature, a fifth difference in primary lattice parameters comprised between 1.25% and 1.75% relative to the lattice parameters of the lattice parameter accommodation primary sub-layer of a second nature.

In one implementation of the optoelectronic device, the lattice parameter accommodation primary sub-layer of a third nature contains a third alloy of gallium, indium and nitrogen.

In one implementation of the optoelectronic device, each pixel includes at least one secondary sub-pixel comprising at least one secondary light-emitting diode adapted to emit a second light radiation substantially having a second wavelength different from the first wavelength and formed on the support face of the substrate, each secondary light-emitting diode comprising:
- at least a first secondary semiconductor portion offset relative to the first primary semiconductor portion in a general plane parallel to the support face, electrically connected to a first electrode and doped according to a first doping type selected among a N-type doping and a P-type doping, the first secondary semiconductor portion having a generally wired shape elongated along a longitudinal axis A extending in the first direction, the first secondary semiconductor portion including a top end opposite to a proximal end of the first secondary semiconductor portion facing towards the support face of the substrate,
- at least one secondary lattice parameter accommodation layer arranged at least on, and in contact with, the top end of the first secondary semiconductor portion,
- a second secondary active semiconductor portion formed by epitaxial growth from the secondary lattice parameter accommodation layer, the second secondary active semiconductor portion being arranged at least on, and in contact with, the secondary lattice parameter accommodation layer,
- a third secondary semiconductor portion electrically connected to a second electrode and doped according to a second doping type opposite to the first doping type and arranged at least on and in contact with, the second secondary active semiconductor portion,
- in which the second secondary active semiconductor portion is configured so as to emit said second light radiation when at least one of the first and second electrodes is powered,
- and in which the secondary lattice parameter accommodation layer has, at least at its interface with the second secondary active semiconductor portion, a first difference in secondary lattice parameters comprised between 3.51% and 0.30% relative to the second secondary active semiconductor portion.

In one implementation of the optoelectronic device, said at least one secondary lattice parameter accommodation layer comprises at least one of the following sub-layers:
- a lattice parameter accommodation secondary sub-layer of a first nature configured so that the second light radiation capable of being emitted by the second secondary active semiconductor portion formed on, and in contact with, said a lattice parameter accommodation secondary sub-layer of a first nature is generally blue-colored by consisting of light rays having essentially wavelengths comprised between the first minimum value equal to 440 nm and the first maximum value equal to 500 nm,
- a lattice parameter accommodation secondary sub-layer of a second nature configured so that the second light radiation capable of being emitted by the second secondary active semiconductor portion formed on, and in contact with, said secondary lattice parameter accommodation layer of a second nature is generally green-colored by consisting of light rays having essentially wavelengths comprised between the second minimum value equal to 500 nm and the second maximum value equal to 570 nm,
- a lattice parameter accommodation secondary sub-layer of a third nature configured so that the second light radiation capable of being emitted by the second secondary active semiconductor portion formed on, and in contact with, said a lattice parameter accommodation secondary sub-layer of a third nature is generally red-colored by consisting of light rays having essentially wavelengths comprised between the third minimum value equal to 570 nm and the third maximum value equal to 680 nm.

In one implementation of the optoelectronic device, each pixel includes at least one tertiary sub-pixel comprising at least one secondary light-emitting diode adapted to emit a third light radiation having substantially a third wavelength different from the first wavelength and from the second wavelength and formed on the support face of the substrate, each tertiary light-emitting diode comprising:
- at least a first tertiary semiconductor portion offset relative to the first primary semiconductor portion and relative to the first secondary semiconductor portion in a general plane parallel to the support face electrically connected to a first electrode and doped according to a first doping type selected among a N-type doping and a P-type doping, the first tertiary semiconductor portion having a generally wired shape elongated along a longitudinal axis A extending in the first direction, the first tertiary semiconductor portion including a top end opposite to a proximal end of the first tertiary semiconductor portion facing towards the support face of the substrate,
- at least one tertiary lattice parameter accommodation layer arranged at least on, and in contact with, the top end of the first tertiary semiconductor portion,
- a second tertiary active semiconductor portion formed by epitaxial growth from the tertiary lattice parameter accommodation layer, the second tertiary active semiconductor portion being arranged at least on, and in contact with, the tertiary lattice parameter accommodation layer,
- a third tertiary semiconductor portion electrically connected to a second electrode and doped according to a second doping type opposite to the first doping type and arranged at least on, and in contact with, the second tertiary active semiconductor portion, in which the second tertiary active semiconductor portion is configured so as to emit said third light radiation when at least one of the first and second electrodes is powered, and in which the tertiary lattice parameter accommodation layer has, at least at its interface with the second active tertiary semiconductor portion, a first tertiary lattice parameter difference comprised between 4.39% and 1.21% relative to the second tertiary active semiconductor portion.

In one implementation of the optoelectronic device, said at least one tertiary lattice parameter accommodation layer comprises at least one of the following sub-layers:

a lattice parameter accommodation tertiary sub-layer of a first nature configured so that the third light radiation capable of being emitted by the second tertiary active semiconductor portion formed on, and in contact with, said lattice parameter accommodation tertiary sub-layer of a first nature is generally blue-colored by consisting of light rays having essentially wavelengths comprised between the first minimum value equal to 440 nm and the first maximum value equal to 500 nm, a lattice parameter accommodation tertiary sub-layer of a second nature configured so that the third light radiation capable of being emitted by the second tertiary active semiconductor portion formed on, and in contact with, said lattice parameter accommodation tertiary sub-layer of a second nature is generally green-colored by consisting of light rays having essentially wavelengths comprised between the second minimum value equal to 500 nm and the second maximum value equal to 570 nm, a lattice parameter accommodation tertiary sub-layer of a third nature configured so that the third light radiation capable of being emitted by the second tertiary active semiconductor portion formed on, and in contact with, said lattice parameter accommodation tertiary sub-layer of a third nature is generally red-colored by consisting of light rays having essentially wavelengths comprised between the third minimum value equal to 570 nm and the third maximum value equal to 680 nm.

The disclosure also relates to the implementation of a method for manufacturing an optoelectronic device comprising a plurality of pixels, in which the formation of said plurality of pixels comprises the implementation of a first phase consisting, for each pixel, of forming at least one primary sub-pixel comprising at least one primary light-emitting diode adapted to emit a first light radiation substantially having a first wavelength and formed on a support face of a substrate, the first phase comprising the following steps:

a) formation, on the support face of the substrate, of at least one first primary semiconductor portion intended to be electrically connected to a first electrode and doped according to a first doping type selected among a N-type doping and a P-type doping, the first primary semiconductor portion having a generally wired shape elongated along a longitudinal axis A extending in a first direction generally perpendicular to the support face of the substrate, the first primary semiconductor portion including a top end opposite to a proximal end of the first primary semiconductor portion facing towards the support face of the substrate;

b) formation of at least one primary lattice parameter accommodation layer at least on, and in contact with, the top end of the first primary semiconductor portion formed in step a;

c) formation of a second primary active semiconductor portion by epitaxial growth from the primary lattice parameter accommodation layer formed in step b, the second primary active semiconductor portion being arranged on and in contact with, the primary lattice parameter accommodation layer;

d) formation of a third primary semiconductor portion intended to be electrically connected to a second electrode and doped according to a second doping type opposite to the first doping type, at least on, and in contact with, the second primary active semiconductor portion;

the second primary active semiconductor portion formed in step c being configured so as to emit said first light radiation when at least one of the first and second electrodes is powered;

the primary lattice parameter accommodation layer formed in step b) has, at least at its interface with the second primary active semiconductor portion formed in step c), a first difference in primary lattice parameters comprised between 2.12% and 0.93% relative to the second primary active semiconductor portion.

Some preferred, but non-limiting, aspects of the manufacturing method are as follows.

In one implementation of the method, step b) includes at least one of the following sub-steps:

b1) formation of at least one lattice parameter accommodation primary sub-layer of a first nature configured so that the first light radiation capable of being emitted by the second primary active semiconductor portion formed at step c) on, and in contact with, said lattice parameter accommodation primary sub-layer of a first nature is generally blue-colored by consisting of light rays having essentially wavelengths comprised between a first minimum value equal to 440 nm and a first maximum value equal to 500 nm;

b2) formation of lattice parameter accommodation primary sub-layer of a second nature, the lattice parameter accommodation primary sub-layer of second nature configured such that the first light radiation capable of being emitted by the second primary active semiconductor portion formed in step c) on, and in contact with, said lattice parameter accommodation primary sub-layer of a second nature is generally green-colored by consisting of light rays having essentially wavelengths comprised between a second minimum value equal to 500 nm and a second maximum value equal to 570 nm;

b3) formation of at least one lattice parameter accommodation primary sub-layer of a third nature configured so that the first light radiation capable of being emitted by the second primary active semiconductor portion formed at the step c) on, and in contact with, said lattice parameter accommodation primary sub-layer of a third nature is generally red-colored, consisting of light rays having essentially wavelengths comprised between a third minimum value equal to 570 nm and a third maximum value equal to 680 nm.

In one implementation of the method, the formation of said plurality of pixels comprises the implementation of a second phase essentially simultaneously with the first phase and consisting, for each pixel, in forming at least one secondary sub-pixel comprising at least one secondary light-emitting diode adapted to emit a second light radiation having substantially a second wavelength different from the first wavelength and formed on the support face of the substrate, the second phase comprising the following steps:

e) formation, on the support face of the substrate, a first secondary semiconductor portion offset relative to the first primary semiconductor portion in a general plane parallel to the support face, intended to be electrically connected to a first electrode and doped according to a first doping type selected among N-type doping and P-type doping, the first secondary semiconductor portion having a generally wired shape elongated along a longitudinal axis A extending in the first direction, the first secondary semiconductor portion including a top end opposite to a proximal end of the first secondary semiconductor portion facing towards the support face of the substrate, step e) being carried out at the same time and with the same technique as step a);

f) formation of at least one secondary lattice parameter accommodation layer at least on, and in contact with, the top end of the first secondary semiconductor portion formed in step e);

g) formation of a second secondary active semiconductor portion by epitaxial growth from the secondary lattice parameter accommodation layer formed in step f), the second secondary active semiconductor portion being arranged on, and in contact with, the secondary lattice parameter accommodation layer, step g) being carried out at the same time and with the same technique as step c);

h) formation of a third secondary semiconductor portion intended to be electrically connected to a second electrode and doped according to a second doping type opposite to the first doping type, at least on, and in contact with, the second secondary active semiconductor portion;

the second secondary active semiconductor portion formed in step g) being configured so as to emit said second light radiation when at least one of the first and second electrodes is powered;

the secondary lattice parameter accommodation layer being formed in step f) has, at least at its interface with the second secondary active semiconductor portion formed in step g), a first difference in secondary lattice parameters comprised between 3.51% and 0.30% relative to the second secondary active semiconductor portion.

In one implementation of the method, step f) includes at least one of the following sub-steps:

f1) formation of at least one a lattice parameter accommodation secondary sub-layer of a first nature configured so that the second light radiation capable of being emitted by the second secondary active semiconductor portion formed in step g) on, and in contact with, said a lattice parameter accommodation secondary sub-layer of a first nature is generally blue-colored by consisting of light rays having essentially wavelengths comprised between the first minimum value equal to 440 nm and the first maximum value equal to 500 nm, the lattice parameter accommodation secondary sub-layer of a first nature being similar in composition and in thickness to the lattice parameter accommodation primary sub-layer of a first nature and step f1) being carried out at the same time and by the same technique as step b1);

f2) formation of a lattice parameter accommodation secondary sub-layer of a second nature configured so that the second light radiation capable of being emitted by the second secondary active semiconductor portion formed in step g) on, and in contact with, said a lattice parameter accommodation secondary sub-layer of a second nature is generally green-colored by consisting of light rays having essentially wavelengths comprised between the second minimum value equal to 500 nm and the second maximum value equal to 570 nm, the lattice parameter accommodation secondary sub-layer of a second nature being similar in composition and thickness to the lattice parameter accommodation primary sub-layer of a second nature and step f2) being carried out at the same time and by the same technique as step b2);

f3) formation of at least one a lattice parameter accommodation secondary sub-layer of a third nature configured so that the second light radiation capable of being emitted by the second secondary active semiconductor portion formed in step g) on, and in contact with, said a lattice parameter accommodation secondary sub-layer of a third nature is generally red-colored consisting of light rays having essentially wavelengths comprised between the third minimum value equal to 570 nm and the third maximum value equal to 680 nm, the lattice parameter accommodation secondary sub-layer of a third nature being similar in composition and thickness to the lattice parameter accommodation primary sub-layer of a third nature and step f3) being carried out at the same time and by the same technique as step b3).

In one implementation of the method, the formation of said plurality of pixels comprises the implementation of a third phase essentially simultaneously with the first phase and the second phase and consisting, for each pixel, of forming at the same time as the first phase and the second phase at least one tertiary sub-pixel comprising at least one tertiary light-emitting diode adapted to emit a third light radiation substantially having a third wavelength different from the first wavelength and from the second wavelength and formed on the support face of the substrate, the third phase comprising the following steps:

i) formation, on the support face of the substrate, of a first tertiary semiconductor portion offset relative to the first primary semiconductor portion and relative to the first secondary semiconductor portion in a general plane parallel to the support face, intended to be electrically connected to a first electrode and doped according to a first doping type selected among a N-type doping and a P-type doping, the first tertiary semiconductor portion having a generally wired shape elongated along a longitudinal axis A extending in the first direction, the first tertiary semiconductor portion having a top end opposite to a proximal end of the first tertiary semiconductor portion facing the support face of the substrate, step i) being carried out in the same time and with the same technique as step a) and step e);

j) forming at least one tertiary lattice parameter accommodation layer at least on, and in contact with, the top end of the first tertiary semiconductor portion formed in step i);

k) formation of a second tertiary active semiconductor portion by epitaxial growth from the tertiary lattice parameter accommodation layer formed in step j), the second tertiary active semiconductor portion being arranged on, and in contact with, the tertiary lattice parameter accommodation layer, step k) being carried out at the same time and with the same technique as step c) and as step g);

l) formation of a third tertiary semiconductor portion intended to be electrically connected to a second electrode and doped according to a second doping type opposite to the first doping type, at least on, and in contact with, the second tertiary active semiconductor portion;

the second tertiary active semiconductor portion formed in step k) being configured so as to emit said third light radiation when at least one of the first and second electrodes is powered;

the tertiary lattice parameter accommodation layer being formed in step j) has, at least at its interface with the second tertiary active semiconductor portion formed in step k), a first difference in tertiary lattice parameters comprised between 4.39% and 1.21% relative to the second secondary active semiconductor portion.

In one implementation of the method, step j) includes at least one of the following sub-steps:

j1) formation of at least one lattice parameter accommodation tertiary sub-layer of a first nature configured so that the third light radiation capable of being emitted by the second tertiary active semiconductor portion formed at step k) on, and in contact with, said lattice parameter accommodation tertiary sub-layer of a first nature is generally blue-colored, consisting of light rays having essentially wavelengths comprised between the first minimum value equal to 440 nm and the first maximum value equal to 500 nm, the lattice parameter accommodation tertiary sub-layer of a first nature being similar in composition and in thickness to the lattice parameter accommodation primary sub-layer of a first nature and to the lattice parameter accommodation secondary sub-layer of a first nature and step j1) being carried out at the same time and by the same technique as step b1) and that step f);

j2) formation of a lattice parameter accommodation tertiary sub-layer of a second nature configured so that the third light radiation capable of being emitted by the second tertiary active semiconductor portion formed in step k) on, and in contact with, said lattice parameter accommodation tertiary sub-layer of a second nature is generally green-colored by consisting of light rays having essentially wavelengths comprised between the second minimum value equal to 500 nm and the second maximum value equal to 570 nm, the lattice parameter accommodation tertiary sub-layer of a second nature being similar in composition and thickness to the lattice parameter accommodation primary sub-layer of a second nature and to the lattice parameter accommodation secondary sub-layer of a second nature and step j2) being carried out at the same time and by the same technique as step b2) and step f2);

j3) formation of at least one lattice parameter accommodation tertiary sub-layer of a third nature configured so that the third light radiation capable of being emitted by the second tertiary active semiconductor portion formed at step k) on, and in contact with, said lattice parameter accommodation tertiary sub-layer of a third nature is generally red-colored by consisting of light rays having essentially wavelengths comprised between the third minimum value equal to 570 nm and the third maximum value equal to 680 nm, the lattice parameter accommodation tertiary sub-layer of a third nature being similar in composition and thickness to the lattice parameter accommodation primary sub-layer of a third nature and to the lattice parameter accommodation secondary sub-layer of a third nature and step j3) being carried out at the same time and by the same technique as step b3) and that step f3).

BRIEF DESCRIPTION OF THE DRAWINGS

Other aspects, objects, advantages and features of the disclosure will appear better on reading the following detailed description of preferred embodiments thereof, provided as a non-limiting example, and made with reference to the appended drawings in which.

DETAILED DESCRIPTION OF THE DRAWINGS

Figure 1:
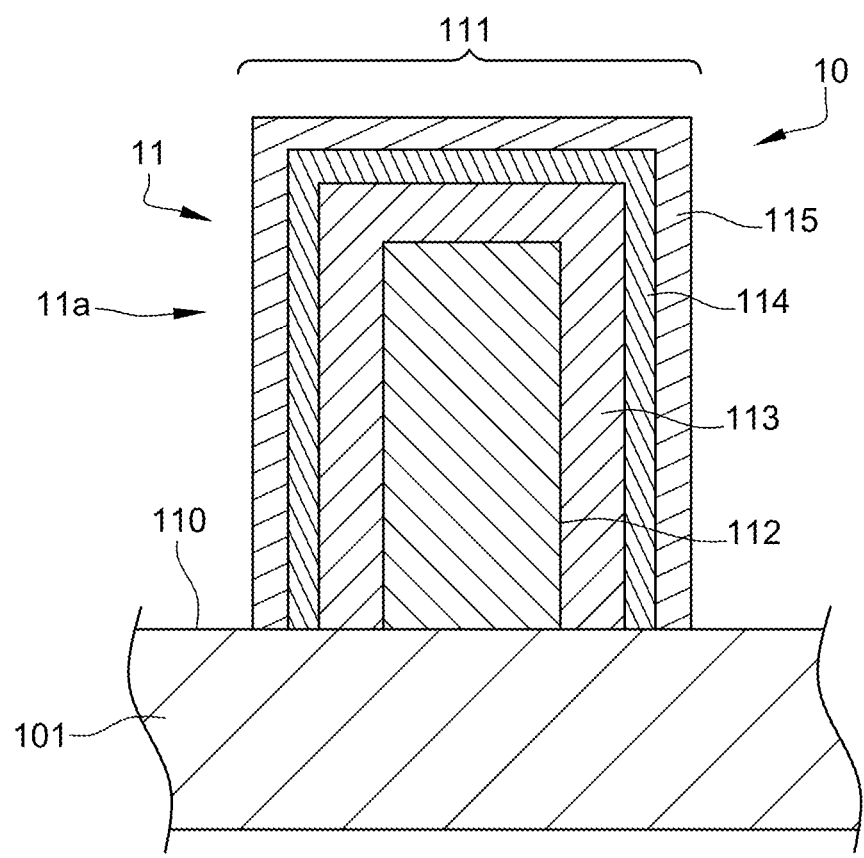
FIG. 1 represents a schematic cross-sectional view of a light-emitting diode of «core-shell» type architecture according to a first embodiment of the disclosure.

In the figures and in the remainder of the description, the same reference numerals represent identical or similar elements. In addition, the different elements are not represented to scale so as to enhance clarity of the figures. Moreover, the different embodiments and variants do not exclude one another and may be combined together.

In the following description, unless indicated otherwise, the terms «substantially», «about» and «in the range of» mean «within 10%».

For exclusively illustration purposes, but without any limitation, each of the accompanying figures represents only an assembly comprising a few light-emitting diodes 111, 121, 131. The number of light-emitting diodes per sub-pixel 11a, 11b, 11c and the number of pixels, are however in no way limited.

The disclosure relates firstly to an optoelectronic device 10, comprising a plurality of pixels 11 each comprising at least one primary sub-pixel 11a comprising at least one primary light-emitting diode 111 adapted to emit a first light radiation substantially having a first wavelength and formed on a support face 110 of a substrate 101.

Thanks to the arrangement of three-dimensional light-emitting diodes of the disclosure, a particularly targeted application is the provision of an image display screen or of an image projection device.

It is also clear that the manufacturing methods can concern other applications, in particular the detection or measurement of electromagnetic radiations or else photovoltaic applications.

The optoelectronic device 10 is obtained starting from a substrate 101, having a support face 110, which is an element common to the various embodiments.

The substrate 101 is consisting for example, by a stack of a monolithic layer (not represented), of a lower electrode layer (not represented) which can be a seed layer or called a conductive nucleation layer and of a first electrically insulating layer (not represented). Those skilled in the art could refer, for example, to document FR-A1-3053530 for the provision of such a substrate 101.

The support face 110 of the substrate 101 is formed, for example, by the exposed face of said first electrically insulating layer or of the nucleation layer.

The monolithic layer can be formed from a semiconductor material doped or not, for example $Al_2O_3$ or silicon or even germanium, and more particularly monocrystalline silicon. It can also be formed from sapphire or even from a III-V semiconductor material, for example GaN. It can alternatively be a silicon-on-insulator type substrate or «SOI». Alternatively, the monolithic layer can be formed in an electrically insulating material.

The lower electrode layer can serve as a seed layer for the growth of light-emitting diode portions. The lower electrode layer can be continuous or discontinuous. The material composing the lower electrode layer may be a nitride, carbide or boride of a transition metal from column IV, V or VI of the periodic table of the elements or a combination of these compounds. For example, the lower electrode layer can be made of aluminum nitride, aluminum oxide, boron, boron nitride, titanium, titanium nitride, tantalum, tantalum nitride, hafnium, hafnium nitride, niobium, niobium nitride, zirconium, zirconium boride, zirconium nitride, silicon carbide, tantalum nitride and carbide, or magnesium nitride under the formula $Mg_xN_y$, where x is approximately equal to 3 and y is approximately equal to 2, for example magnesium nitride under the formula $Mg_3N_2$. The lower electrode layer can be doped and of the same type of conductivity as that of the semiconductor elements intended to grow, and have a thickness for example comprised between 1 nm and 200 nm, preferably comprised between 10 nm and 50 nm. The lower electrode layer can consist of an alloy or a stack of at least one material mentioned in the above list.

Said first electrically insulating layer may comprise a first intermediate insulating layer which covers said lower electrode layer. It forms a growth mask authorizing the epitaxial growth, for example, of the various light-emitting diodes 111, 121, 131 from through openings emerging locally on the surfaces of the lower electrode layer. Said first electrical insulation layer also participates in providing electrical insulation between the first lower electrodes (not represented) and the second upper electrodes (not represented). The first intermediate insulating layer is made of at least one dielectric material(s) such as, for example, a silicon oxide (for example $SiO_2$ or SiON) or a silicon nitride (for example $Si_3N_4$ or SiN), or even a silicon oxynitride, an aluminum oxide (for example $Al_2O_3$) or a hafnium oxide (for example $HfO_2$). The thickness of the first intermediate insulating layer may be comprised between 5 nm and 1 µm, preferably comprised between 20 nm and 500 nm, for example equal to approximately 100 nm.

Said first layer of electrically insulating material may further include a second intermediate electrically insulating layer (not represented) which covers the first lower electrodes and participates in providing electrical insulation between the first lower electrodes and the second upper electrodes. Said second electrically intermediate insulating layer may also cover the growth mask formed by the first intermediate insulating layer. The second intermediate insulating layer can be made of a dielectric material identical to or different from that of the growth mask, such as, for example, a silicon oxide (for example $SiO_2$) or a silicon nitride (for example $Si_3N_4$ or SiN), or even a silicon oxynitride, an aluminum oxide (for example $Al_2O_3$) or a hafnium oxide (for example $HfO_2$). The thickness of the second intermediate insulating layer may be comprised between 5 nm and 1 µm, preferably comprised between 20 nm and 500 nm, for example equal to approximately 100 nm.

At least one light-emitting diode 111 adapted to emit a first light radiation having substantially a first wavelength is formed on the substrate 101. Each light-emitting diode 111 has a substantially wired shape elongated along a longitudinal axis A extending in a first direction 111a generally perpendicular to the support face 110 of the substrate 101.

Each light-emitting diode 111 comprises at least one first primary semiconductor portion 112 electrically connected to a first electrode. Generally, each light-emitting diode is connected to a first lower electrode, formed in the substrate (not represented and which may be the seed layer), which is continuous or not. Those skilled in the art will be able to refer to patent FR3053530 to produce the substrate 101 containing the appropriate lower electrodes. The first primary semiconductor portion 112 is doped according to a first doping type selected among a N-type doping and a P-type doping. The first primary semiconductor portion 112 has a generally wired shape elongated along the longitudinal axis A extending in a first direction 111a generally perpendicular to the support face 110 of the substrate 101. The first primary semiconductor portion 112 is therefore of three-dimensional shape, according to micrometric or nanometric dimensions. Preferably, the first primary semiconductor portion 112 has a substantially wired, conical or frustoconical shape. In the text, the terms «three-dimensional» or «wired» or «frustoconical» or «conical» are equivalent. The first primary semiconductor portion 112 includes a top end 112a opposite a proximal end of the first primary semiconductor portion 112 facing towards the support face 110 of the substrate 101.

In the description and in the figures, the embodiments are described for wired light-emitting diodes 111, 121, 131.

By way of example, the first primary semiconductor portion 112, but this is also valid for the first secondary and tertiary semiconductor portions 122 and 132, can be, at least in part, formed from group IV semiconductor materials such as silicon or germanium or else mainly including a III-V compound, for example III-N compounds. Examples of Group III comprise gallium, indium or aluminum. Examples of compounds III-N are GaN, AlN, InGaN or AlInGaN. Other elements of group V can also be used, for example, phosphorus, arsenic or antimony. Generally, the elements in compound III-V can be combined with different mole fractions. It should be noted that the first primary semiconductor portion 112 can indifferently be formed from semiconductor materials mainly comprising a compound II-VI. The dopant can be selected, in the case of a compound III-V, among the group comprising a P-type dopant of group II, for example magnesium, zinc, cadmium or mercury, a P-type dopant of group IV, for example carbon, or a N-type dopant from group IV, for example silicon, germanium, selenium, sulfur, terbium or tin.

The right section of the first primary semiconductor portion 112, but this is also valid for the first secondary and tertiary semiconductor portions 122 and 132, may have different shapes such as, for example, an oval, circular or polygonal shape (for example square, rectangular, triangular, hexagonal) shape.

In general, the various layers or sub-layers making up the light-emitting diodes 111, 121, 131 can be obtained by any technique of those skilled in the art such as for example: chemical vapor deposition (CVD), an atomic layer deposition (ALD), or physical vapor deposition (PVD) but preferably by epitaxy (for example MBE, MOVPE).

Figure 2:
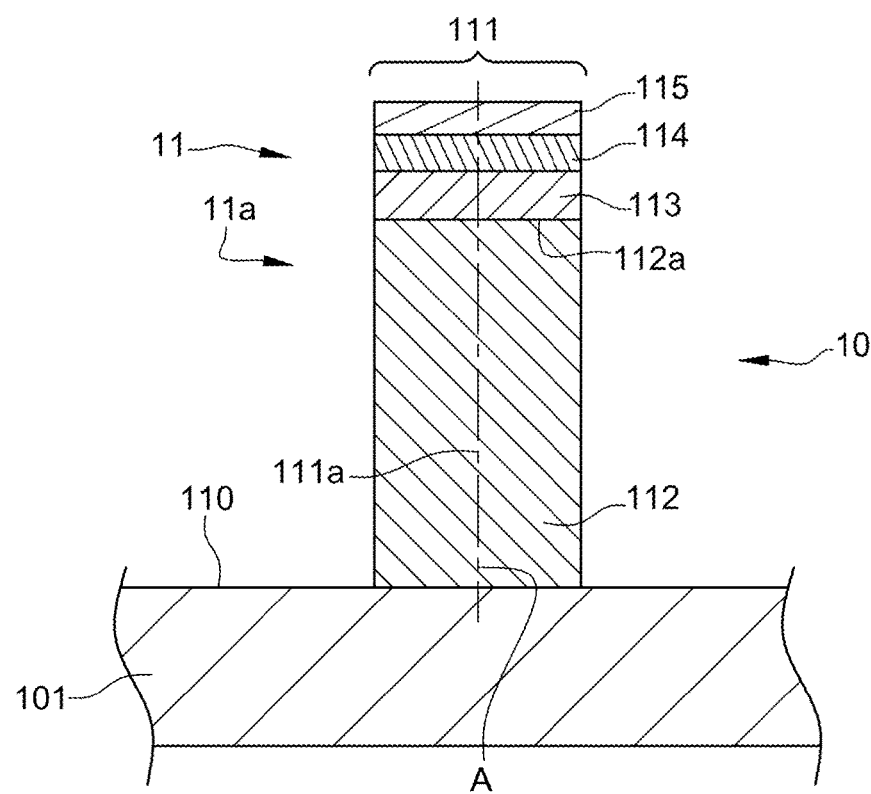
FIG. 2 represents a schematic cross-sectional view of an «axial» type light-emitting diode according to a first embodiment of the disclosure.

As illustrated in FIGS. 1 and 2, each light-emitting diode 111 comprises at least one primary lattice parameter accommodation layer 113 arranged at least on, and in contact with, the top end 112a of the first primary semiconductor portion 112.

As illustrated in FIGS. 1 and 2, each light-emitting diode 111 comprises at least a second primary active semiconductor portion 114 formed by epitaxial growth from the primary lattice parameter accommodation layer 113. This second primary active semiconductor portion 114 is arranged at least on, and in contact with, the primary lattice parameter accommodation layer 113.

Figure 9:
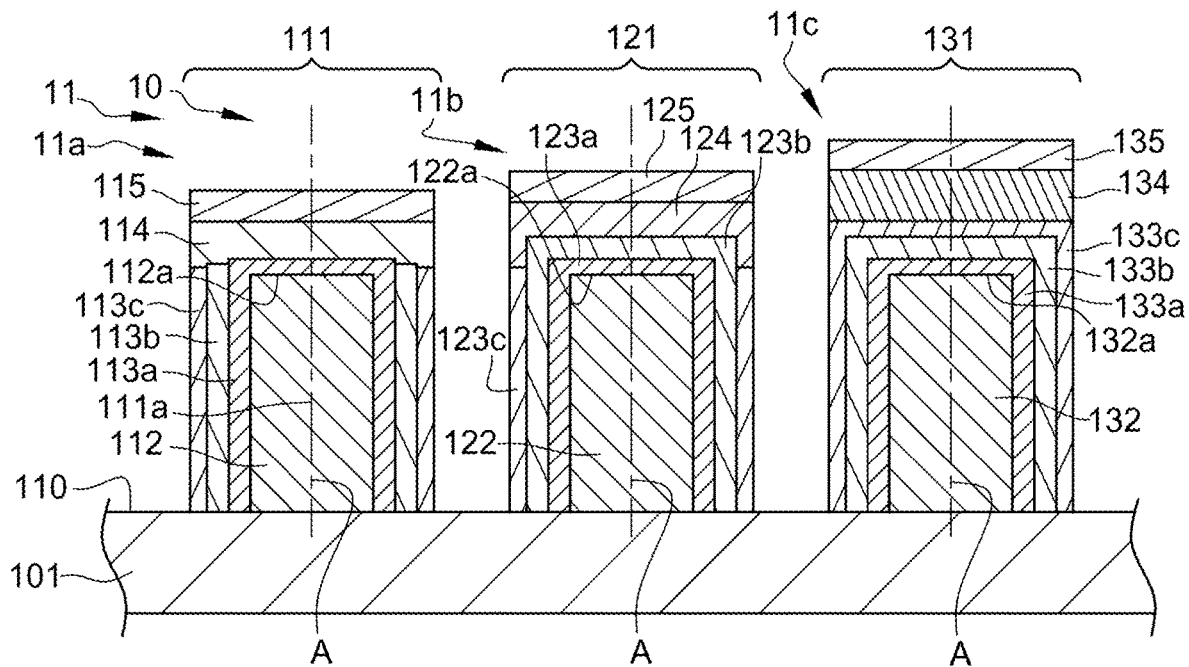
FIG. 9 represents a schematic view of an additional step of a manufacturing method according to the disclosure of a primary sub-pixel comprising a primary light-emitting diode, of a secondary sub-pixel comprising a secondary light-emitting diode and of a tertiary sub-pixel comprising a tertiary light-emitting diode, as viewed in cross section.

As illustrated in FIGS. 1, 2 and 9, each light-emitting diode 111 comprises at least one third primary semiconductor portion 115 electrically connected to a second electrode. This third primary semiconductor portion 115 is doped according to a second doping type opposite to the first doping type. It is arranged at least on, and in contact with, the second primary active semiconductor portion 114. This third primary semiconductor portion 115 is, in one example, identical for at least all the primary and secondary and tertiary light-emitting diodes consisting at least one sub-pixel. This third primary semiconductor portion 115 can be formed from group IV semiconductor materials such as silicon or germanium or mainly including a compound III-V, for example compounds III-N. Examples of group III comprise gallium, indium or aluminum. Examples of compounds III-N are GaN, AlN, InGaN or AlInGaN. Other elements of group V can also be used, for example, phosphorus, arsenic or antimony. Generally, the elements in compound III-V can be combined with different mole fractions. It should be noted that the first primary semiconductor portion 112 can indifferently be formed from semiconductor materials mainly including a compound II-VI. The dopant can be selected, in the case of a compound III-V, from the group comprising a P-type dopant of group II, for example magnesium, zinc, cadmium or mercury, a P-type dopant of group IV, for example carbon, or a N-type dopant from group IV, for example silicon, germanium, selenium, sulfur, terbium or tin.

The second electrode is preferentially transparent and can be formed in one example of a transparent conductive oxide such as doped tin oxide or even doped zinc oxide covered or not partially covered by a metal electrode layer.

The second primary active semiconductor portion 114 is configured so as to emit said first light radiation when at least one of the first and second electrodes is powered. The color emitted or in other words the wavelength emitted from the second primary active semiconductor portion 114 is in particular dependent on its indium concentration. The second primary active semiconductor portion 114 may include means for confining the electric charge carriers, such as single or multiple quantum wells. It consists for example of an alternation of layers of GaN and InGaN having respective thicknesses of 5 to 20 nm (for example 8 nm) and of 1 to 15 nm (for example 2.5 nm). The GaN layers can be doped, for example of N or P type. According to another example, the active layer can comprise a single layer of InGaN, for example with a thickness greater than 10 nm.

The primary lattice parameter accommodation layer 113 has, at least at its interface with the second primary active semiconductor portion 114, a first difference in primary lattice parameter comprised between 2.32% and 0.93% relative to the second primary active semiconductor portion 114.

The primary lattice parameter accommodation layer 113 thus configured allows serving as a basis for the epitaxial growth of a second primary active semiconductor portion 114 whose indium concentration will be at least in part determined by the first difference in primary lattice parameter of the primary lattice parameter accommodation layer 113 relative to the second primary active semiconductor portion 114. This is in particular due to the general fact that a change in indium concentration in a second primary active semiconductor portion 114 involves a change of lattice parameter of said second primary active semiconductor portion 114. Thus, during the epitaxial formation of the second primary active semiconductor portion 114, the atomic species having lattice parameters too far away from the lattice parameters of the primary lattice parameter accommodation layer 113 will be immediately desorbed. Thus, only the alloy forming the second primary active semiconductor portion 114 having the selected indium concentration will be able to grow and form in a perennial manner on the primary lattice parameter accommodation layer 113.

Advantageously, this allows to obtain second primary active semiconductor portions 114 emitting a wavelength independently selected to the diameter of the primary light-emitting diodes 111.

Advantageously, this also allows to obtain in the same reactor, in a single phase, second active semiconductor portions having different indium contents and therefore emitting at different wavelengths.

Thus, in one example, the primary lattice parameter accommodation layer 113 is formed in a material having a difference in lattice parameters comprised between 2% and 2.5% relative to a second primary active semiconductor portion 114 whose indium proportion is comprised between 13% and 20%. A second primary active semiconductor portion 114 thus obtained is able to emit a first radiation comprised between 440 and 500 nm and corresponding to a light radiation which is generally blue-colored.

In another example, the primary lattice parameter accommodation layer 113 is formed in a material having a difference in lattice parameters comprised between 1.5% and 2% relative to a second primary active semiconductor portion 114 whose indium proportion is comprised between 20% and 27%. A second primary active semiconductor portion 114 obtained by epitaxy from this primary lattice parameter accommodation layer 113 is adapted to emit radiation comprised between 500 and 570 nm and corresponding to a light radiation which is generally green-colored.

In another example, the primary lattice parameter accommodation layer 113 is formed from a material having a difference in lattice parameters comprised between 1% and 1.5% relative to a second primary active semiconductor portion 114 whose indium proportion is comprised between 27% and 40%. A second primary active semiconductor portion 114 obtained by epitaxy from this primary lattice parameter accommodation layer 113 is adapted to emit a radiation comprised between 570 and 680 nm and corresponding to a light radiation which is generally red-colored. The primary lattice parameter accommodation layer 113 may have, in one example, at least at its interface with the first primary semiconductor portion 112, a second difference in primary lattice parameter comprised between 1.07% and 2.17% relative to the first primary semiconductor portion 112. In this example, the second difference in primary lattice parameters of 1.07% corresponds to a difference in lattice parameters between GaN and $Al_{0.1}Ga_{0.9}N$ and the second difference in primary lattice parameter of 2.17% corresponds to a difference in lattice parameter between GaN and $In_{0.2}Ga_{0.8}N$. This can be advantageous so that the primary lattice parameter accommodation layer 113 does not exhibit any or few defects during its formation from the first primary semiconductor portion 112. To allow the first and second primary lattice parameter difference conditions explained above to coexist, it may be advantageous to create an atomic concentration gradient in the primary lattice parameter accommodation layer 113. Thus, in one example, it is possible to vary the proportion of gallium or aluminum or indium in the primary lattice parameter accommodation layer 113 in a decreasing manner in the first direction 111a and in a direction opposite to the top end 112a of the first primary semiconductor portion 112, that is to say a direction tending to move away from the top end 112a. Advantageously, this allows to gradually adapt the lattice parameters between the first primary semiconductor portion 112 through the primary lattice parameter accommodation layer 113 up to the second primary active semiconductor portion 114. The stresses are thus reduced and the dislocations avoided.

In this document, the «primary» notion refers only to a first sub-pixel of a given pixel, this first sub-pixel being intended to emit light according to a first color. The «secondary» notion refers only to a second sub-pixel of the pixel, this second sub-pixel being intended to emit light according to a second color different from the first color. The «tertiary» notion refers only to a third sub-pixel of the pixel, this third sub-pixel being intended to emit light according to a third color different from the first color and from the second color. In other words, the terms «primary», «secondary» and «tertiary» induce no notion on the order of manufacture or on the order of importance between the different sub-pixels.

Figure 3:
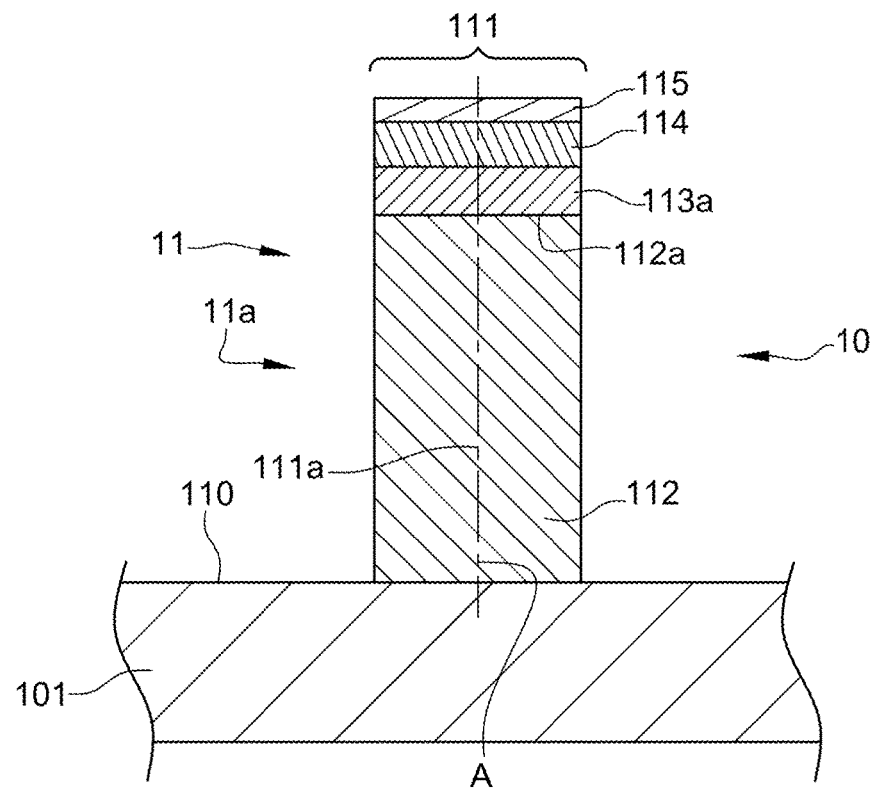
FIG. 3 represents a schematic cross-sectional view of an «axial» type light-emitting diode according to a second embodiment of the disclosure.

In a second embodiment illustrated in FIG. 3, the primary lattice parameter accommodation layer 113 includes at least one lattice parameter accommodation primary sub-layer of a first nature 113a. It is configured so that the second primary active semiconductor portion 114, formed on and in contact with said lattice parameter accommodation primary sub-layers of a first nature 113a, is able to emit a first light radiation, generally blue-colored by consisting of light rays having essentially wavelengths comprised between a first minimum value equal to 440 nm and a first maximum value equal to 500 nm.

In one example, the lattice parameter accommodation primary sub-layer of a first nature 113a has, at least at its interface with the first primary semiconductor portion 112, a third difference in primary lattice parameters comprised between 1.07% and 0.65% relative to the lattice parameters of the first primary semiconductor portion 112.

In one example, the lattice parameter accommodation primary sub-layer of a first nature 113a contains a first alloy of aluminum, gallium, indium and nitrogen, in particular containing a gallium proportion decreasing in the first direction 111a and in a direction opposite to the top end 112a of the first primary semiconductor portion 112.

Figure 4:
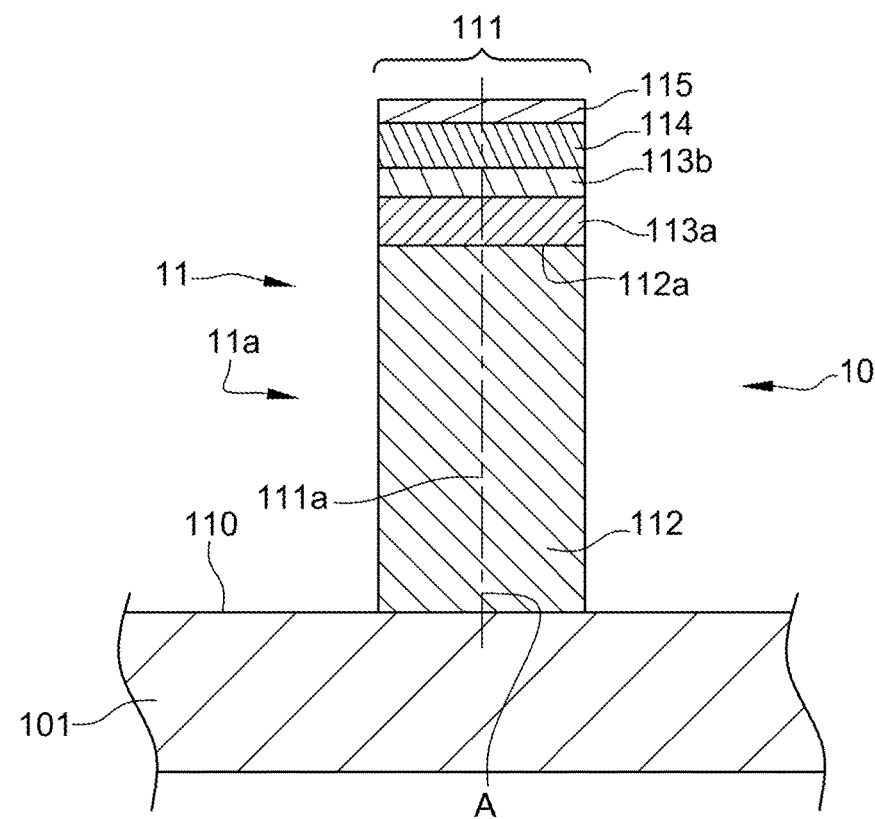
FIG. 4 represents a schematic cross-sectional view of an «axial» type light-emitting diode according to a third embodiment of the disclosure.

In a third embodiment illustrated in FIG. 4, the primary lattice parameter accommodation layer 113 includes at least one lattice parameter accommodation primary sub-layer of a second nature 113b. The latter is configured so that the first light radiation capable of being emitted by the second primary active semiconductor portion 114 formed on, and in contact with, said lattice parameter accommodation primary sub-layer of a second nature 113b is generally green-colored by consisting of light rays having essentially wavelengths comprised between a second minimum value equal to 500 nm and a second maximum value equal to 570 nm.

In one example, the lattice parameter accommodation primary sub-layer of a second nature 113b is arranged at least on, and in contact with, the lattice parameter accommodation primary sub-layer of a first nature 113a. The lattice parameter accommodation primary sub-layer of a second nature 113b has, at least at its interface with the lattice parameter accommodation primary sub-layer of a first nature 113a, a fourth difference in primary lattice parameters comprised between 1.71% and 3.22% relative to the lattice parameters of the lattice parameter accommodation primary sub-layer of a first nature 113a.

In another example, the lattice parameter accommodation primary sub-layer of a second nature 113b contains a second alloy of gallium, indium and nitrogen, in particular containing an indium proportion decreasing in the first direction 111a and in the direction opposite to the top end 112a of the first primary semiconductor portion 112.

Figure 5:
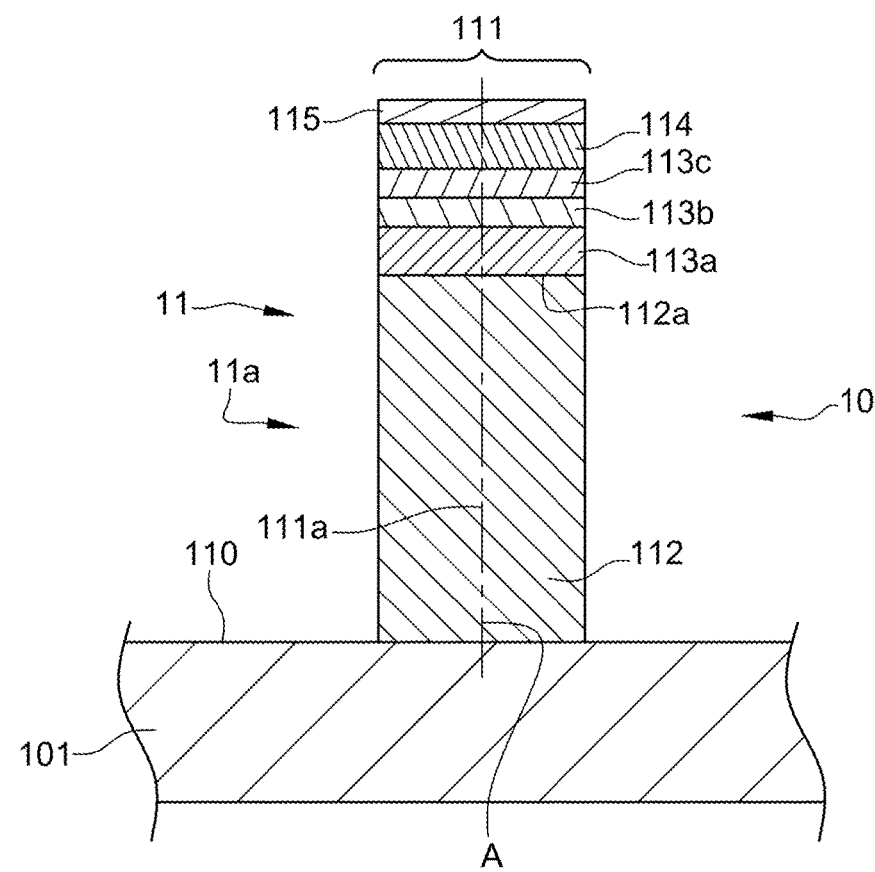
FIG. 5 represents a schematic cross-sectional view of an «axial» type light-emitting diode according to a fourth embodiment of the disclosure.
Figure 6:
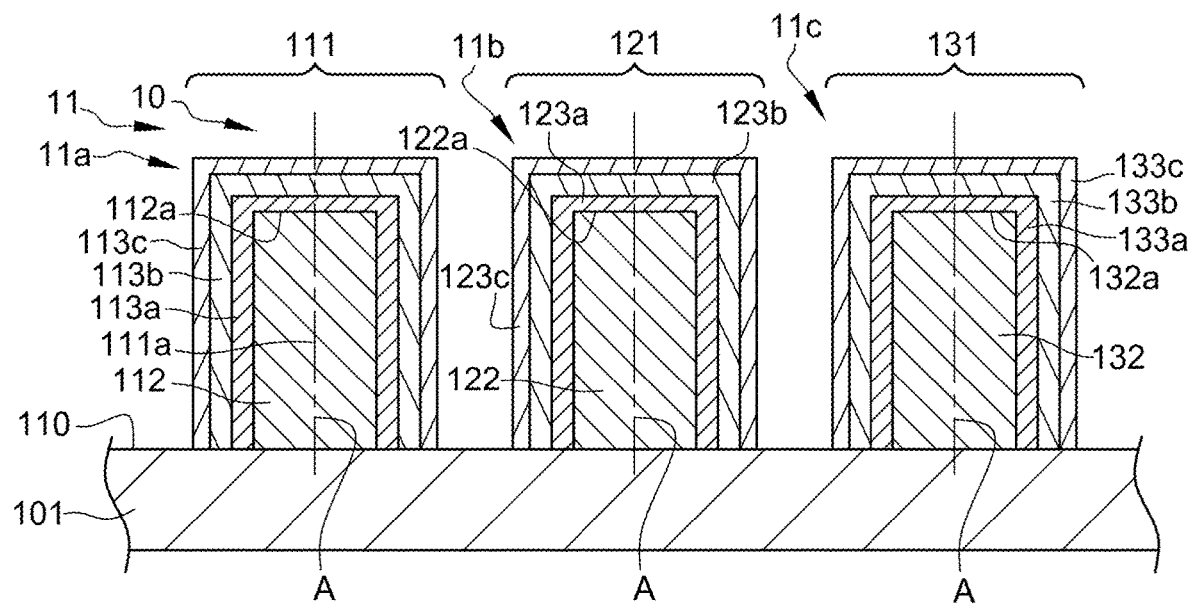
FIG. 6 represents a schematic view of a step of a manufacturing method according to the disclosure of a primary sub-pixel comprising a primary light-emitting diode, of a secondary sub-pixel comprising a secondary light-emitting diode and of a tertiary sub-pixel comprising a tertiary light-emitting diode, as viewed in cross section.
Figure 7:
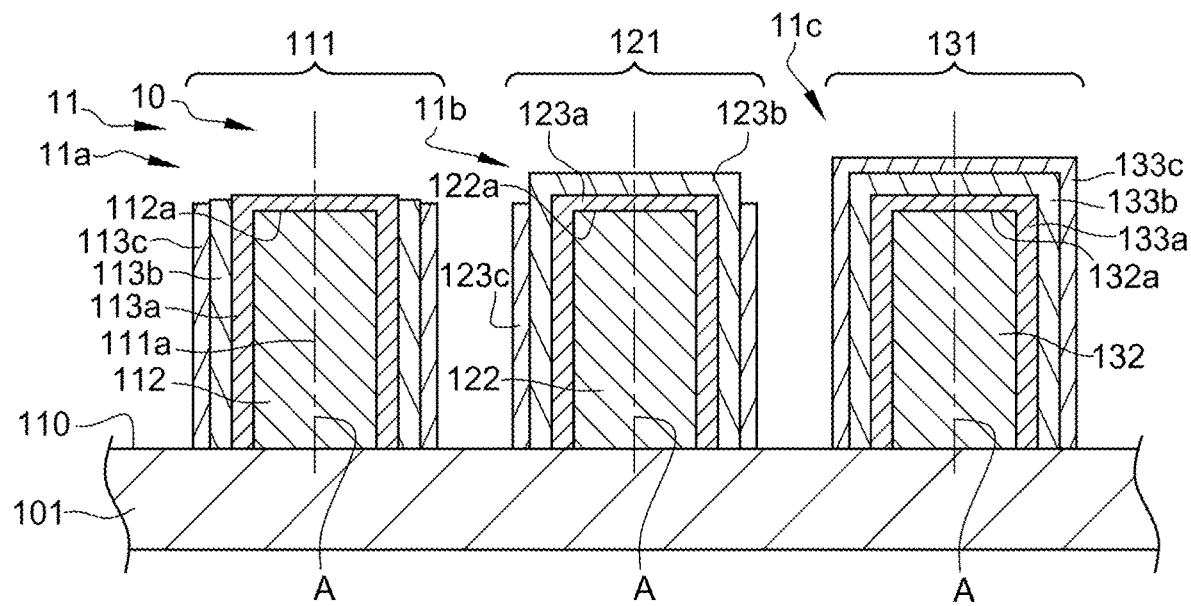
FIG. 7 represents a schematic view of an additional step of a manufacturing method according to the disclosure of a primary sub-pixel comprising a primary light-emitting diode, of a secondary sub-pixel comprising a secondary light-emitting diode and of a tertiary sub-pixel comprising a tertiary light-emitting diode, as viewed in cross section.
Figure 8:
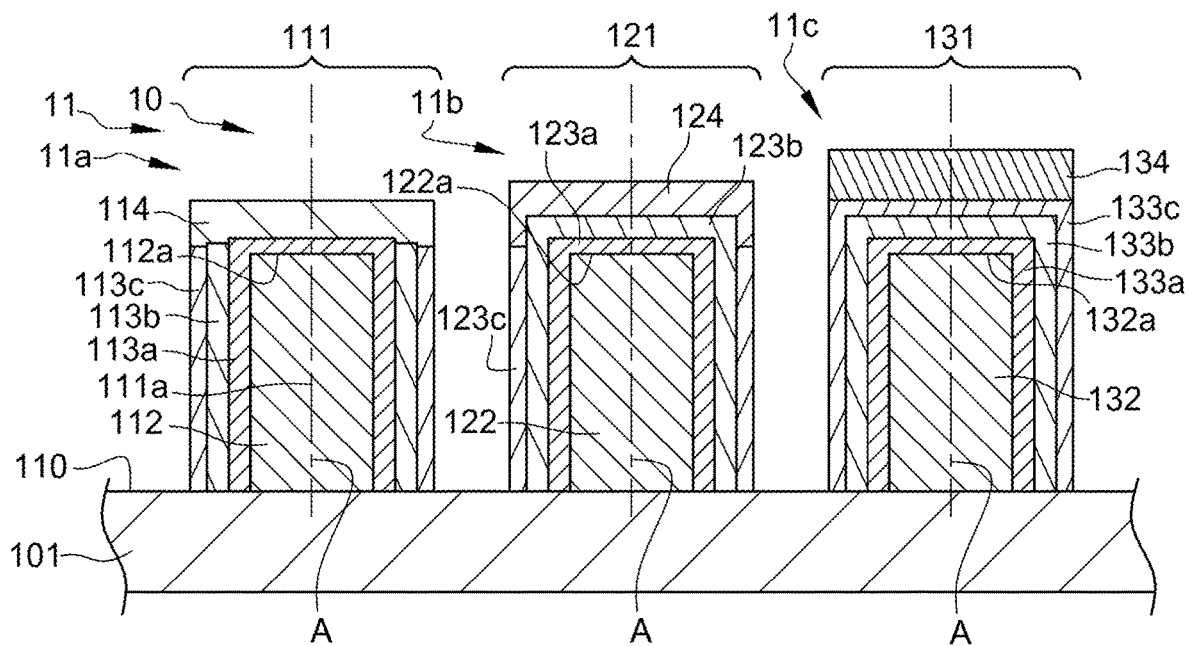
FIG. 8 represents a schematic view of another step of a manufacturing method according to the disclosure of a primary sub-pixel comprising a primary light-emitting diode, of a secondary sub-pixel comprising a secondary light-emitting diode and of a tertiary sub-pixel comprising a tertiary light-emitting diode, as viewed in cross section.

In a fourth embodiment illustrated in FIG. 5, the primary lattice parameter accommodation layer 113 includes at least one lattice parameter accommodation primary sub-layer of a third nature 113c. The second primary active semiconductor portion 114 formed on, and in contact with the lattice parameter accommodation primary sub-layer of a third nature 113c, preferably by epitaxy, is adapted to emit the first light radiation so that it is generally red-colored by consisting of light rays having essentially wavelengths comprised between a third minimum value equal to 570 nm and a third maximum value equal to 680 nm.

In one example, the lattice parameter accommodation primary sub-layer of a third nature 113c is arranged at least on, and in contact with, the lattice parameter accommodation primary sub-layer of a second nature 113b. The lattice parameter accommodation primary sub-layer of a third nature 113c then has, at least at its interface with the lattice parameter accommodation primary sub-layer of a second nature 113b, a fifth difference in primary lattice parameters comprised between 1.25% and 1.75% relative to the lattice parameters of the lattice parameter accommodation primary sub-layer of a second nature 113b.

In another example, the lattice parameter accommodation primary sub-layer of a third nature 113c contains a third alloy of gallium, indium and nitrogen.

In a fifth embodiment, each pixel 11 includes at least one secondary sub-pixel 11b comprising at least one secondary light-emitting diode 121 adapted to emit a second light radiation having substantially a second wavelength different from the first wavelength and formed on the support face 110 of the substrate 101. Each secondary light-emitting diode 121 comprises:

- at least a first secondary semiconductor portion 122 offset relative to the first primary semiconductor portion 112 in a general plane parallel to the support face 110, electrically connected to a first electrode and doped according to a first doping type selected among a N-type doping and a P-type doping, the first secondary semiconductor portion 122 having a generally wired shape elongated along a longitudinal axis A extending in the first direction 111*a*, the first secondary semiconductor portion 122 including a top end 122*a* opposite to a proximal end of the first secondary semiconductor portion 122 facing towards the support face 110 of the substrate 101,
- at least one secondary lattice parameter accommodation layer 123 arranged at least on, and in contact with, the top end 122*a* of the first secondary semiconductor portion 122,
- a second secondary active semiconductor portion 124 formed by epitaxial growth from the secondary lattice parameter accommodation layer 123, the second secondary active semiconductor portion 124 being arranged at least on, and in contact with, the secondary lattice parameter accommodation layer 123,
- a third secondary semiconductor portion 125 electrically connected to a second electrode and doped according to a second doping type opposite to the first doping type and arranged at least on, and in contact with, the second secondary active semiconductor portion 124.

The second secondary active semiconductor portion 124 is configured so as to emit said second light radiation when at least one of the first and second electrodes is powered.

The secondary lattice parameter accommodation layer 123 has, at least at its interface with the second secondary active semiconductor portion 124, a first difference in secondary lattice parameters comprised between 3.51% and 0.30% relative to the second secondary active semiconductor portion 124.

In a sixth embodiment illustrated in FIG. 9 at least one secondary lattice parameter accommodation layer 123 comprises at least one of the following sub-layers:

- a lattice parameter accommodation secondary sub-layer of a first nature 123*a* configured so that the second light radiation capable of being emitted by the second secondary active semiconductor portion 124 formed on, and in contact with, said lattice parameter accommodation secondary sub-layer of a first nature 123*a* is generally blue-colored by consisting of light rays having essentially wavelengths comprised between the first minimum value equal to 440 nm and the first maximum value equal to 500 nm,
- a lattice parameter accommodation secondary sub-layer of a second nature 123*b* configured so that the second light radiation capable of being emitted by the second secondary active semiconductor portion 124 formed on, and in contact with, said lattice parameter accommodation secondary sub-layer of a second nature 123*b* is generally green-colored by consisting of light rays having essentially wavelengths comprised between the second minimum value equal to 500 nm and the second maximum value equal to 570 nm,
- a lattice parameter accommodation secondary sub-layer of a third nature 123*c* configured so that the second light radiation capable of being emitted by the second secondary active semiconductor portion 124 formed on, and in contact with, said lattice parameter accommodation secondary sub-layer of a third nature 123*b* is generally red-colored by consisting of light rays having essentially wavelengths comprised between the third minimum value equal to 570 nm and the third maximum value equal to 680 nm.

Preferably, the lattice parameter accommodation secondary sub-layer of a third nature 123*c* is of the same composition and/or formed at the same time as the lattice parameter accommodation primary sub-layer of a third nature 113*c*.

Preferably, the lattice parameter accommodation secondary sub-layer of a first nature 123*a* is of the same composition and/or formed at the same time as the lattice parameter accommodation primary sub-layer of a first nature 113*a*.

Preferably, the lattice parameter accommodation secondary sub-layer of a second nature 123*b* is of the same composition and/or formed at the same time as the lattice parameter accommodation primary sub-layer of a second nature 113*b*.

In a seventh embodiment illustrated in FIG. 9, each pixel 11 includes at least one tertiary sub-pixel 11*c* comprising at least one secondary light-emitting diode 131 adapted to emit a third light radiation having substantially a third wavelength different from the first wavelength and from the second wavelength and formed on the support face 110 of the substrate 101. Each tertiary light-emitting diode 131 comprises:

- at least one first tertiary semiconductor portion 132 offset relative to the first primary semiconductor portion 112 and relative to the first secondary semiconductor portion 122 in a general plane parallel to the support face 110 electrically connected to a first electrode and doped according to a first doping type selected among a N-type doping and a P-type doping, the first tertiary semiconductor portion 132 having a generally wired shape elongated along a longitudinal axis A extending in the first direction 111*a*, the first tertiary semiconductor portion 132 including a top end 132*a* opposite to a proximal end of the first tertiary semiconductor portion 132 facing towards the support face 110 of the substrate 101,
- at least one tertiary lattice parameter accommodation layer 133 arranged at least on, and in contact with, the top end 132*a* of the first tertiary semiconductor portion 132,
- a second tertiary active semiconductor portion 134 formed by epitaxial growth from the tertiary lattice parameter accommodation layer 133, the second tertiary active semiconductor portion 134 being arranged at least on, and in contact with, the tertiary lattice parameter accommodation layer 133,
- a third tertiary semiconductor portion 135 electrically connected to a second electrode and doped according to a second doping type opposite to the first doping type and arranged at least on, and in contact with, the second tertiary active semiconductor portion 134.

In this embodiment, the second tertiary active semiconductor portion 134 is configured so as to emit said third light radiation when at least one of the first and second electrodes is powered.

In this embodiment, the tertiary lattice parameter accommodation layer 133 has, at least at its interface with the second tertiary active semiconductor portion 134, a first difference in tertiary lattice parameters comprised between 4.39% and 1.21% relative to the second tertiary active semiconductor portion 134.

In one example, at least one tertiary lattice parameter accommodation layer 133 comprises at least one of the following sub-layers:

- a lattice parameter accommodation tertiary sub-layer of a first nature 133a configured so that the third light radiation capable of being emitted by the second tertiary active semiconductor portion 134 formed on, and in contact with, said the lattice parameter accommodation tertiary sub-layer of a first nature 133a is generally blue-colored by consisting of light rays having essentially wavelengths comprised between the first minimum value equal to 440 nm and the first maximum value equal to 500 nm,
- a lattice parameter accommodation tertiary sub-layer of a second nature 133b configured so that the third light radiation capable of being emitted by the second tertiary active semiconductor portion 134 formed on, and in contact with, said lattice parameter accommodation tertiary sub-layer of a second nature 133b is generally green-colored by consisting of light rays having essentially wavelengths comprised between the second minimum value equal to 500 nm and the second maximum value equal to 570 nm,
- a lattice parameter accommodation tertiary sub-layer of a third nature 133c configured so that the third light radiation capable of being emitted by the second tertiary active semiconductor portion 134 formed on, and in contact with, said lattice parameter accommodation tertiary sub-layer of a third nature 133c is globally red-colored by consisting of light rays having essentially wavelengths comprised between the third minimum value equal to 570 nm and the third maximum value equal to 680 nm.

Preferably, the lattice parameter accommodation tertiary sub-layer of a third nature 133c is of the same composition and/or formed at the same time as the lattice parameter accommodation primary sub-layer of a third nature 113c.

Preferably, the lattice parameter accommodation tertiary sub-layer of a first nature 133a is of the same composition and/or formed at the same time as the lattice parameter accommodation primary sub-layer of a first nature 113a.

Preferably, the lattice parameter accommodation tertiary sub-layer of a second nature 133b is of the same composition and/or formed at the same time as the lattice parameter accommodation primary sub-layer of a second nature 113b.

An optoelectronic device 11 obtained with primary, secondary and tertiary light-emitting diodes 111, 121, 131 as described beforehand advantageously makes it possible to obtain light-emitting diodes of different colors without using light converters, which is less expensive.

Advantageously, this allows to obtain light-emitting diodes with a larger diameter and therefore to improve the light intensity, in particular for blue light-emitting diodes.

Another advantage arises from the fact that a single active layer growth step may be used to manufacture multiple active layer compositions if different accommodation layers of different natures are used for different light-emitting diodes.

The disclosure also covers a method for manufacturing an optoelectronic device 10, some steps of which are illustrated in FIGS. 6 to 9.

The optoelectronic device 10 includes a plurality of pixels 11, in which the formation of said plurality of pixels 11 comprises the implementation of a first phase consisting, for each pixel 11, in forming at least one primary sub-pixel 111a comprising at least one primary light-emitting diode 111 adapted to emit a first light radiation having substantially a first wavelength and formed on a support face 110 of a substrate 101. The first phase comprises the following steps:

a) formation, on the support face 110 of the substrate 101, of at least one first primary semiconductor portion 112 intended to be electrically connected to a first electrode and doped according to a first doping type selected among a N-type doping and a P-type doping, the first primary semiconductor portion 112 having a generally wired shape elongated along a longitudinal axis A extending in a first direction 111a generally perpendicular to the support face 110 of the substrate 101, the first primary semiconductor portion 112 including a top end 112a opposite to a proximal end of the first primary semiconductor portion 112 facing towards the support face 110 of the substrate 101;

b) formation of at least one primary lattice parameter accommodation layer 113 at least on, and in contact with, the top end 112a of the first primary semiconductor portion 112 formed in step a);

c) formation of a second primary active semiconductor portion 114 by epitaxial growth from the primary lattice parameter accommodation layer 113 formed in step b), the second primary active semiconductor portion 114 being arranged on, and in contact with, the primary lattice parameter accommodation layer 113;

d) formation of a third primary semiconductor portion 115 intended to be electrically connected to a second electrode and doped according to a second doping type opposite to the first doping type, at least on, and in contact with, the second primary active semiconductor portion 114.

The second primary active semiconductor portion 114 formed in step c) is configured so as to emit said first light radiation when at least one of the first and second electrodes is powered. The primary lattice parameter accommodation layer 113 formed in step b) has, at least at its interface with the second primary active semiconductor portion 114 formed in step c), a first difference in primary lattice parameters comprised between 2.12% and 0.93% relative to the second primary active semiconductor portion 114.

In one example, step b) includes at least one of the following sub-steps:

b1) formation of at least one lattice parameter accommodation primary sub-layer of a first nature 113a configured so that the first light radiation capable of being emitted by the second primary active semiconductor portion 114 formed in step c) on, and in contact with, said lattice parameter accommodation primary sub-layer of a first nature 113a is generally blue-colored by consisting of light rays having essentially wavelengths comprised between a first minimum value equal to 440 nm and a first maximum value equal to 500 nm;

b2) formation of a lattice parameter accommodation primary sub-layer of a second nature 113b, the lattice parameter accommodation primary sub-layer of second nature 113b configured so that the first light radiation capable of being emitted by the second primary active semiconductor portion 114 formed in step c) on, and in contact with, said lattice parameter accommodation primary sub-layer of a second nature 113b is generally green-colored by consisting of light rays having essentially wavelengths comprised between a second minimum value equal to 500 nm and a second maximum value equal to 570 nm;

b3) formation of at least one lattice parameter accommodation primary sub-layer of a third nature 113c configured so that the first light radiation capable of being emitted by the second primary active semiconductor portion 114 formed in step c) on, and in contact with, said lattice parameter accommodation primary sub-layer of a third nature 113b is generally red-colored by consisting of light rays having essentially wavelengths comprised between a third minimum value equal to 570 nm and a third maximum value equal to 680 nm.

In another example, the formation of said plurality of pixels 11 comprises the implementation of a second phase essentially simultaneously with the first phase and consisting, for each pixel 11, in forming at least one secondary sub-pixel 11b comprising at least one secondary light-emitting diode 121 adapted to emit a second light radiation having substantially a second wavelength different from the first wavelength and formed on the support face 110 of the substrate 101. The second phase comprises the following steps:

- e) formation, on the support face 110 of the substrate 101, of a first secondary semiconductor portion 122 offset relative to the first primary semiconductor portion 112 in a general plane parallel to the support face 110, intended to be electrically connected to a first electrode and doped according to a first doping type selected among a N-type doping and a P-type doping, the first secondary semiconductor portion 122 having a generally wired shape elongated along a longitudinal axis A extending in the first direction 111a, the first secondary semiconductor portion 122 including a top end 122a opposite to a proximal end of the first secondary semiconductor portion 122 facing towards the support face 110 of the substrate 101, step e) being carried out at the same time and with the same technique as step a);
- f) formation of at least one secondary lattice parameter accommodation layer 123 at least on, and in contact with, the top end 122a of the first secondary semiconductor portion 122 formed in step e);
- g) formation of a second secondary active semiconductor portion by epitaxial growth from the secondary lattice parameter accommodation layer 123 formed in step f), the second secondary active semiconductor portion 124 being arranged on, and in contact with, the secondary lattice parameter accommodation layer 123, step g) being carried out at the same time and with the same technique as step c);
- h) formation of a third secondary semiconductor portion 125 intended to be electrically connected to a second electrode and doped according to a second doping type opposite to the first doping type, at least on, and in contact with, the second secondary active semiconductor portion 124.

The second secondary active semiconductor portion 124 formed in step g) is configured so as to emit said second light radiation when at least one of the first and second electrodes is powered.

The secondary lattice parameter accommodation layer 123 formed in step f) has, at least at its interface with the second secondary active semiconductor portion 124 formed in step g), a first difference in secondary lattice parameters comprised between 3.51% and 0.30% relative to the second secondary active semiconductor portion 124.

In one example, step f) includes at least one of the following sub-steps:

- f1) formation of at least one lattice parameter accommodation secondary sub-layer of a first nature 123a configured so that the second light radiation capable of being emitted by the second secondary active semiconductor portion 124 formed in step g) on, and in contact with, said lattice parameter accommodation secondary sub-layer of a first nature 123a is generally blue-colored by consisting of light rays having essentially wavelengths comprised between the first minimum value equal to 440 nm and the first maximum value equal to 500 nm, the lattice parameter accommodation secondary sub-layer of a first nature 123a being similar in composition and thickness to the lattice parameter accommodation primary sub-layer of a first nature 113a and step f1) being carried out at the same time and by the same technique as step b1);
- f2) formation of a lattice parameter accommodation secondary sub-layer of a second nature 123b configured so that the second light radiation capable of being emitted by the second secondary active semiconductor portion 124 formed in step g) on, and in contact with, said lattice parameter accommodation secondary sub-layer of a second nature 123b is generally green-colored by consisting of light rays having essentially wavelengths comprised between the second minimum value equal to 500 nm and the second maximum value equal to 570 nm, the lattice parameter accommodation secondary sub-layer of a second nature 123b being similar in composition and in thickness to the lattice parameter accommodation primary sub-layer of a second nature 113b and step f2) being carried out at the same time and by the same technique as step b2);
- f3) formation of at least one lattice parameter accommodation secondary sub-layer of a third nature 123c configured so that the second light radiation capable of being emitted by the second secondary active semiconductor portion 124 formed in step g) on, and in contact with, said lattice parameter accommodation secondary sub-layer of a third nature 123c is generally red-colored by consisting of light rays having essentially wavelengths comprised between the third minimum value equal to 570 nm and the third maximum value equal to 680 nm. The lattice parameter accommodation secondary sub-layer of a third nature 123c is similar in composition and in thickness to the lattice parameter accommodation primary sub-layer of a third nature 113c. Step f3) is carried out at the same time and by the same technique as step b3).

In another example, the formation of said plurality of pixels 11 comprises the implementation of a third phase essentially simultaneously with the first phase and with the second phase and consisting, for each pixel 11, in forming at least one tertiary sub-pixel 11c comprising at least one tertiary light-emitting diode 131 adapted to emit a third light radiation having substantially a third wavelength different from the first wavelength and from the second wavelength and formed on the support face 110 of the substrate 101. The third phase comprises the following steps:

- i) formation, on the support face 110 of the substrate 101, of a first tertiary semiconductor portion 132 offset relative to the first primary semiconductor portion 112 and relative to the first secondary semiconductor portion 122 in a general plane parallel to the support face 110, intended to be electrically connected to a first electrode and doped according to a first doping type selected among a N-type doping and a P-type doping, the first tertiary semiconductor portion 132 having a generally wired shape elongated according to a longitudinal axis A extending in the first direction 111a, the first tertiary semiconductor portion 122 including a top end 132a opposite to a proximal end of the first tertiary semiconductor portion 132 facing towards the support face 110 of the substrate 101, step i) being carried out in the same time and with the same technique as step a) and as step e);

j) formation of at least one tertiary lattice parameter accommodation layer 133 at least on, and in contact with, the top end 132a of the first tertiary semiconductor portion 132 formed in step i);

k) formation of a second tertiary active semiconductor portion 134 by epitaxial growth from the tertiary lattice parameter accommodation layer 133 formed in step j), the second tertiary active semiconductor portion 134 being arranged on, and in contact with, the tertiary lattice parameter accommodation layer 133, step k) being carried out at the same time and with the same technique as step c) and as step g);

l) formation of a third tertiary semiconductor portion 135 intended to be electrically connected to a second electrode and doped according to a second doping type opposite to the first doping type, at least on, and in contact with, the second tertiary active semiconductor portion 134.

In this example, the second tertiary active semiconductor portion 134 formed in step k) being configured so as to emit said third light radiation when at least one of the first and second electrodes is powered;

In addition, the tertiary lattice parameter accommodation layer 133 formed in step j) has, at least at its interface with the second tertiary active semiconductor portion 134 formed in step k), a first difference in tertiary lattice parameters comprised between 4.39% and 1.21% relative to the second secondary active semiconductor portion 124.

In a complementary example, step j) includes at least one of the following sub-steps:

j1) formation of at least one lattice parameter accommodation tertiary sub-layer of a first nature 133a configured so that the third light radiation capable of being emitted by the second tertiary active semiconductor portion 134 formed in step k) on, and in contact with, said lattice parameter accommodation tertiary sub-layer of a first nature 133a is generally blue-colored by consisting of light rays having essentially wavelengths comprised between the first minimum value equal to 440 nm and the first maximum value equal to 500 nm, the lattice parameter accommodation tertiary sub-layer of a first nature 133a being similar in composition and in thickness to the lattice parameter accommodation primary sub-layer of a first nature 113a and to the lattice parameter accommodation secondary sub-layer of a first nature 123a and step j1) being carried out at the same time and by the same technique as step b1) and as step f1);

j2) formation of a lattice parameter accommodation tertiary sub-layer of a second nature 133b configured so that the third light radiation capable of being emitted by the second tertiary active semiconductor portion 134 formed in step k) on, and in contact with, said lattice parameter accommodation tertiary sub-layer of a second nature 133b is generally green-colored by consisting of light rays having essentially wavelengths comprised between the second minimum value equal to 500 nm and the second maximum value equal to 570 nm, the lattice parameter accommodation tertiary sub-layer of a second nature 133b being similar in composition and in thickness to the lattice parameter accommodation primary sub-layer of a second nature 113b and to the lattice parameter accommodation secondary sub-layer of a second nature 123b and step j2) being carried out at the same time and by the same technique as step b2) and as step f2);

j3) formation of at least one lattice parameter accommodation tertiary sub-layer of a third nature 133c configured so that the third light radiation capable of being emitted by the second tertiary active semiconductor portion 134 formed in step k) on, and in contact with, said lattice parameter accommodation tertiary sub-layer of a third nature 133c is generally red-colored by consisting of light rays having essentially wavelengths comprised between the third minimum value equal to 570 nm and the third maximum value equal to 680 nm. The lattice parameter accommodation tertiary sub-layer of a third nature 133c is similar in composition and in thickness to the lattice parameter accommodation primary sub-layer of a third nature 113c and to the lattice parameter accommodation secondary sub-layer of a third nature 123c. Step j3) is carried out at the same time and by the same technique as step b3) and as step f3).

Before carrying out step c), it may be necessary to carry out etching operations of the lattice parameter accommodation primary sub-layers of a third nature 113c and the lattice parameter accommodation primary sub-layers of a second nature 113b. The etching may be carried out, for example, by plasma or by a wet process, or even by using mechanical-chemical polishing.

Likewise, before carrying out step g), it may be necessary to carry out operations for etching the lattice parameter accommodation secondary sub-layers of a third nature 123c in order to expose the lattice parameter accommodation secondary sub-layer of a second nature 123b. The etching may be carried out, for example, by plasma or by a wet process, or even by using mechanical-chemical polishing.

The illustrated figures refer to axial or "core-shell" type structures, the disclosure may indifferently concern the two types of light-emitting diode structures.

The first and second electrodes are intentionally not represented and the person skilled in the art will be able to use his knowledge to produce them.

Of course, the disclosure is not limited to the embodiments represented and described above, but on the contrary covers all the variants and combinations thereof.

The invention claimed is:

1. An optoelectronic device comprising a plurality of pixels each including at least one primary sub-pixel comprising at least one primary light-emitting diode adapted to emit a first light radiation having substantially a first wavelength and formed on a support face of a substrate, each primary light-emitting diode comprising:

at least a first primary semiconductor portion electrically connected to a first electrode and doped according to a first doping type selected among a N-type doping and P-type doping, the first primary semiconductor portion having a general wired shape elongated along a longitudinal axis extending in a first direction generally perpendicular to the support face of the substrate, the first primary semiconductor portion including a top end opposite to a proximal end of the first primary semiconductor portion facing towards the support face of the substrate, at least one primary lattice parameter accommodation layer arranged at least on, and in contact with, the top end of the first primary semiconductor portion, a second primary active semiconductor portion formed by epitaxial growth from the primary lattice parameter accommodation layer, the second primary active semiconductor portion being arranged at least on, and in contact with, the primary lattice parameter accommodation layer, a third primary semiconductor portion electrically connected to a second electrode and doped according to a second doping type opposite to the first doping type and arranged at least on, and in contact with, the second primary active semiconductor portion, wherein the second primary active semiconductor portion is configured so as to emit said first light radiation when at least one of the first and second electrodes is powered, and wherein the primary lattice parameter accommodation layer has, at least at its interface with the second primary active semiconductor portion, a first difference in primary lattice parameters comprised between 2.12% and 0.93% relative to the second primary active semiconductor portion.

2. The optoelectronic device according to claim 1, wherein the primary lattice parameter accommodation layer has, at least at its interface with the first primary semiconductor portion, a second difference in primary lattice parameters comprised between 1.07% and 2.17% relative to the first primary semiconductor portion.

3. The optoelectronic device according to claim 1, wherein the primary lattice parameter accommodation layer includes at least one lattice parameter accommodation primary sub-layer of a first nature configured so that the first light radiation capable of being emitted by the second primary active semiconductor portion formed on, and in contact with, said lattice parameter accommodation primary sub-layer of a first nature is generally blue-colored by comprising light rays having wavelengths comprised between a first minimum value equal to 440 nm and a first maximum value equal to 500 nm.

4. The optoelectronic device according to claim 3, wherein the lattice parameter accommodation primary sub-layer of a first nature has, at least at its interface with the first primary semiconductor portion, a third difference in primary lattice parameters comprised between 1.07% and 0.65% relative to the lattice parameters of the first primary semiconductor portion.

5. The optoelectronic device according to claim 3, wherein the lattice parameter accommodation primary sub-layer of a first nature contains a first alloy of aluminum, gallium, indium and nitrogen, containing a gallium proportion decreasing in the first direction and in a direction opposite to the top end of the first primary semiconductor portion.

6. The optoelectronic device according to claim 1, wherein the primary lattice parameter accommodation layer includes at least one lattice parameter accommodation primary sub-layer of a second nature configured so that the first light radiation capable of being emitted by the second primary active semiconductor portion formed on, and in contact with, said lattice parameter accommodation primary sub-layer of a second nature is generally green-colored by comprising light rays having wavelengths comprised between a second minimum value equal to 500 nm and a second maximum value equal to 570 nm.

7. The optoelectronic device according to claim 3, wherein the lattice parameter accommodation primary sub-layer of a second nature is arranged at least on, and in contact with, the lattice parameter accommodation primary sub-layer of a first nature and wherein the lattice parameter accommodation primary sub-layer of a second nature has, at least at its interface with the lattice parameter accommodation primary sub-layer of a first nature, a fourth difference in primary lattice parameters comprised between 1.71% and 3.22% relative to the lattice parameters of the lattice parameter accommodation primary sub-layer of a first nature.

8. The optoelectronic device according to claim 6, wherein the lattice parameter accommodation primary sub-layer of a second nature contains a second alloy of gallium, indium and nitrogen, containing an indium proportion decreasing in the first direction and in the direction opposite to the top end of the first primary semiconductor portion.

9. The optoelectronic device according to claim 1, wherein the primary lattice parameter accommodation layer includes at least one lattice parameter accommodation primary sub-layer of a third nature configured such that the first light radiation capable of being emitted by the second primary active semiconductor portion formed on, and in contact with, said lattice parameters accommodation primary sub-layer of a third nature is generally red-colored by comprising light rays having wavelengths comprised between a third minimum value equal to 570 nm and a third maximum value equal to 680 nm.

10. The optoelectronic device according to claim 6, wherein the lattice parameter accommodation primary sub-layer of a third nature is arranged at least on, and in contact with, the lattice parameter accommodation primary sub-layer of a second nature and wherein the lattice parameter accommodation primary sub-layer of a third nature has, at least at its interface with the lattice parameter accommodation primary sub-layer of a second nature, a fifth difference in primary lattice parameters comprised between 1.25% and 1.75% relative to the lattice parameters of the lattice parameter accommodation primary sub-layer of a second nature.

11. The optoelectronic device according to claim 9, wherein the lattice parameter accommodation primary sub-layer of a third nature contains a third alloy of gallium, indium and nitrogen.

12. The optoelectronic device according to claim 1, wherein each pixel includes at least one secondary sub-pixel comprising at least one secondary light-emitting diode adapted to emit a second light radiation having substantially a second wavelength different from the first wavelength and formed on the support face of the substrate, each secondary light-emitting diode comprising:

at least a first secondary semiconductor portion offset relative to the first primary semiconductor portion in a general plane parallel to the support face, electrically connected to a first electrode and doped according to a first doping type selected among a N-type doping and a P-type doping, the first secondary semiconductor portion having a generally wired shape elongated along a longitudinal axis extending in the first direction, the first secondary semiconductor portion including a top end opposite to a proximal end of the first secondary semiconductor portion facing towards the support face of the substrate, at least one secondary lattice parameter accommodation layer arranged at least on, and in contact with, the top end of the first secondary semiconductor portion, a second secondary active semiconductor portion formed by epitaxial growth from the secondary lattice parameter accommodation layer, the second secondary active semiconductor portion being arranged at least on, and in contact with, the secondary lattice parameter accommodation layer, a third secondary semiconductor portion electrically connected to a second electrode and doped according to a second doping type opposite to the first doping type and arranged at least on, and in contact with, the second secondary active semiconductor portion, wherein the second secondary active semiconductor portion is configured so as to emit said second light radiation when at least one of the first and second electrodes is powered, and wherein the secondary lattice parameter accommodation layer has, at least at its interface with the second secondary active semiconductor portion, a first difference in secondary lattice parameters comprised between 3.51% and 0.30% relative to the second secondary active semiconductor portion.

13. The optoelectronic device according to claim 12, wherein said at least one secondary lattice parameter accommodation layer comprises at least one of the following sub-layers:

a lattice parameter accommodation secondary sub-layer of a first nature configured so that the second light radiation capable of being emitted by the second secondary active semiconductor portion formed on, and in contact with of, said lattice parameter accommodation secondary sub-layer of a first nature is generally blue-colored by comprising light rays having wavelengths comprised between the first minimum value equal to 440 nm and the first maximum value equal to 500 nm, a lattice parameter accommodation secondary sub-layer of a second nature configured so that the second light radiation capable of being emitted by the second secondary active semiconductor portion formed on, and in contact with of, said lattice parameter accommodation secondary sub-layer of a second nature is generally green-colored by comprising light rays having wavelengths comprised between the second minimum value equal to 500 nm and the second maximum value equal to 570 nm, a lattice parameter accommodation secondary sub-layer of a third nature configured so that the second light radiation capable of being emitted by the second secondary active semiconductor portion formed on, and in contact with of, said lattice parameter accommodation secondary sub-layer of a third nature is generally red-colored by comprising light rays having wavelengths comprised between the third minimum value equal to 570 nm and the third maximum value equal to 680 nm.

14. The optoelectronic device according to claim 12 wherein each pixel includes at least one tertiary sub-pixel comprising at least one secondary light-emitting diode adapted to emit a third light radiation having substantially a third wavelength different from the first wavelength and from the second wavelength and formed on the support face of the substrate, each tertiary light-emitting diode comprising:

at least one first tertiary semiconductor portion offset relative to the first primary semiconductor portion and relative to the first secondary semiconductor portion in a general plane parallel to the support face electrically connected to a first electrode and doped according to a first doping type selected among a N-type doping and a P-type doping, the first tertiary semiconductor portion having a generally wired shape elongated along a longitudinal axis extending in the first direction, the first tertiary semiconductor portion comprising a top end opposite to a proximal end of the first tertiary semiconductor portion facing towards the support face of the substrate, at least one tertiary lattice parameter accommodation layer arranged at least on, and in contact with, the top end of the first tertiary semiconductor portion, a second tertiary active semiconductor portion formed by epitaxial growth from the tertiary lattice parameter accommodation layer, the second tertiary active semiconductor portion being arranged at least on, and in contact with, the tertiary lattice parameter accommodation layer, a third tertiary semiconductor portion electrically connected to a second electrode and doped according to a second doping type opposite to the first doping type and arranged at least on, and in contact with, the second active tertiary semiconductor portion, wherein the second tertiary active semiconductor portion is configured so that to emit said third light radiation when at least one of the first and second electrodes is powered, and wherein the tertiary lattice parameter accommodation layer has, at least at its interface with the second active tertiary semiconductor portion, a first difference in tertiary lattice parameters comprised between 4.39% and 1.21% relative to the second active tertiary semiconductor portion.

15. The optoelectronic device according to claim 14, wherein said at least one tertiary lattice parameter accommodation layer comprises at least one of the following sub-layers:

a lattice parameter accommodation tertiary sub-layer of a first nature configured so that the third light radiation capable of being emitted by the second tertiary active semiconductor portion formed on, and in contact with, said lattice parameter accommodation tertiary sub-layer of a first nature is generally blue-colored by comprising light rays having wavelengths comprised between the first minimum value equal to 440 nm and the first maximum value equal to 500 nm, a lattice parameter accommodation tertiary sub-layer of a second nature configured so that the third light radiation capable of being emitted by the second tertiary active semiconductor portion formed on, and in contact with, said lattice parameter accommodation tertiary sub-layer of a second nature is generally green-colored by comprising light rays having wavelengths comprised between the second minimum value equal to 500 nm and the second maximum value equal to 570 nm, a lattice parameter accommodation tertiary sub-layer of a third nature configured so that the third light radiation capable of being emitted by the second tertiary active semiconductor portion formed on, and in contact with, said lattice parameter accommodation tertiary sub-layer of a third nature is generally red-colored by comprising light rays having wavelengths comprised between the third minimum value equal to 570 nm and the third maximum value equal to 680 nm.

16. A method for manufacturing an optoelectronic device comprising a plurality of pixels, wherein the formation of said plurality of pixels comprises the implementation of a first phase comprising, for each pixel, in forming at least one primary sub-pixel comprising at least one primary light-emitting diode adapted to emit a first light radiation having substantially a first wavelength and formed on a support face of a substrate, the first phase comprising the following steps:

a) formation, on the support face of the substrate, of at least one first primary semiconductor portion intended to be electrically connected to a first electrode and doped according to a first doping type selected among a N-type doping and a P-type doping, the first primary semiconductor portion having a generally wired shape elongated along a longitudinal axis extending in a first direction generally perpendicular to the support face of the substrate, the first primary semiconductor portion including a top end opposite to a proximal end of the first primary semiconductor portion facing towards the support face of the substrate;

b) formation of at least one primary lattice parameter accommodation layer at least on, and in contact with, the top end of the first primary semiconductor portion formed in step a);

c) formation of a second primary active semiconductor portion by epitaxial growth from the primary lattice parameter accommodation layer formed in step b), the second primary active semiconductor portion being arranged on, and in contact with, the primary lattice parameter accommodation layer;

d) formation of a third primary semiconductor portion intended to be electrically connected to a second electrode and doped according to a second doping type opposite to the first doping type, at least on, and in contact with, the second primary active semiconductor portion;

the second primary active semiconductor portion formed in step c) being configured so as to emit said first light radiation when at least one of the first and second electrodes is powered;

and wherein the primary lattice parameter accommodation layer formed in step b) has, at least at its interface with the second primary active semiconductor portion formed in step c), a first difference in primary lattice parameters comprised between 2.12% and 0.93% relative to the second primary active semiconductor portion.

17. The method for manufacturing an optoelectronic device according to claim 16, wherein step b) includes at least one of the following sub-steps:

b1) formation of at least one lattice parameter accommodation primary sub-layer of a first nature configured so that the first light radiation capable of being emitted by the second primary active semiconductor portion formed in step c) on, and in contact with, said lattice parameter accommodation primary sub-layer of a first nature is generally blue-colored by comprising light rays having wavelengths comprised between a first minimum value equal to 440 nm and a first maximum value equal to 500 nm;

b2) formation of a lattice parameter accommodation primary sub-layer of a second nature (113b), the lattice parameter accommodation primary sub-layer of second nature configured so that the first light radiation capable of being emitted by the second primary active semiconductor portion formed in step c) on, and in contact with, said lattice parameter accommodation primary sub-layer of a second nature is generally green-colored by comprising light rays having wavelengths comprised between a second minimum value equal to 500 nm and a second maximum value equal to 570 nm;

b3) formation of at least one lattice parameter accommodation primary sub-layer of a third nature configured so that the first light radiation capable of being emitted by the second primary active semiconductor portion formed in step c) on, and in contact with, said lattice parameter accommodation primary sub-layer of a third nature is generally red-colored by comprising light rays having wavelengths comprised between a third minimum value equal to 570 nm and a third maximum value equal to 680 nm.

18. The manufacturing method according to claim 17, wherein the formation of said plurality of pixels comprises the implementation of a second phase essentially simultaneously with the first phase and comprising, for each pixel, in forming at least one secondary sub-pixel comprising at least one secondary light-emitting diode adapted to emit a second light radiation having substantially a second wavelength different from the first wavelength and formed on the support face of the substrate, the second phase comprising the following steps:

e) formation, on the support face of the substrate, of a first secondary semiconductor portion offset relative to the first primary semiconductor portion in a general plane parallel to the support face, intended to be electrically connected to a first electrode and doped according to a first doping type selected among a N-type doping and a P-type doping, the first secondary semiconductor portion having a generally wired shape elongated along a longitudinal axis extending in the first direction, the first secondary semiconductor portion including a top end opposite to a proximal end of the first secondary semiconductor portion facing towards the support face of the substrate, step e) being carried out at the same time and with the same technique as step a);

f) formation of at least one secondary lattice parameter accommodation layer at least on, and in contact with, the top end of the first secondary semiconductor portion formed in step e);

g) formation of a second secondary active semiconductor portion by epitaxial growth from the secondary lattice parameter accommodation layer formed in step f), the second secondary active semiconductor portion being arranged on, and in contact with, the secondary lattice parameter accommodation layer, step g) being carried out at the same time and with the same technique as step c);

h) formation of a third secondary semiconductor portion intended to be electrically connected to a second electrode and doped according to a second doping type opposite to the first doping type, at least on, and in contact with, the second secondary active semiconductor portion;

the second secondary active semiconductor portion formed in step g) being configured so as to emit said second light radiation when at least one of the first and second electrodes is powered;

and wherein the secondary lattice parameter accommodation layer formed in step f) has, at least at its interface with the second secondary active semiconductor portion formed in step g), a first difference in secondary lattice parameters comprised between 3.51% and 0.30% relative to the second secondary active semiconductor portion.

19. The manufacturing method according to claim 17, wherein step f) includes at least one of the following sub-steps:

f1) formation of at least one lattice parameter accommodation secondary sub-layer of a first nature configured so that the second light radiation capable of being emitted by the second secondary active semiconductor portion formed in step g) on, and in contact with, said lattice parameter accommodation secondary sub-layer of a first nature is generally blue-colored by comprising light rays having wavelengths comprised between the first minimum value equal to 440 nm and the first maximum value equal to 500 nm, the lattice parameter accommodation secondary sub-layer of a first nature being similar in composition and in thickness to the lattice parameter accommodation primary sub-layer of a first nature and step f1) being carried out at the same time and by the same technique as step b1);

f2) formation of a lattice parameter accommodation secondary sub-layer of a second nature configured so that the second light radiation capable of being emitted by the second secondary active semiconductor portion formed in step g) on, and in contact with, said lattice parameter accommodation secondary sub-layer of a second nature is generally green-colored by comprising light rays having wavelengths comprised between the second minimum value equal to 500 nm and the second maximum value equal to 570 nm, the lattice parameter accommodation secondary sub-layer of a second nature being similar in composition and in thickness to the lattice parameter accommodation primary sub-layer of a second nature and step f2) being carried out at the same time and by the same technique as step b2);

f3) formation of at least one lattice parameter accommodation secondary sub-layer of a third nature configured so that the second light radiation capable of being emitted by the second secondary active semiconductor portion formed in step g) on, and in contact with, said lattice parameter accommodation secondary sub-layer of a third nature is generally red-colored by comprising light rays having wavelengths comprised between the third minimum value equal to 570 nm and the third maximum value equal to 680 nm, the lattice parameter accommodation secondary sub-layer of a third nature is similar in composition and in thickness to the lattice parameter accommodation primary sub-layer of a third nature and step f3) being carried out at the same time and by the same technique as step b3).

20. The manufacturing method according to claim 18, wherein the formation of said plurality of pixels comprises the implementation a third phase essentially simultaneously with the first phase and the second phase and comprising, for each pixel, in forming at least one tertiary sub-pixel comprising at least one tertiary light-emitting diode adapted to emit a third light radiation having substantially a third wavelength different from the first wavelength and from the second wavelength and formed on the support face of the substrate, the third phase comprising the following steps:

i) formation, on the support face of the substrate, a first tertiary semiconductor portion offset relative to the first primary semiconductor portion and relative to the first secondary semiconductor portion in a general plane parallel to the face support, intended to be electrically connected to a first electrode and doped according to a first doping type selected among a N-type doping and a P-type doping, the first tertiary semiconductor portion having a generally wired shape elongated along a longitudinal axis extending in the first direction, the first tertiary semiconductor portion including a top end opposite to a proximal end of the first tertiary semiconductor portion facing towards the support face of the substrate, step i) being carried out at the same time and with the same technique as step a) and as step e);

j) formation of at least one tertiary lattice parameter accommodation layer at least on, and in contact with, the top end of the first tertiary semiconductor portion formed in step i);

k) formation of a second tertiary active semiconductor portion by epitaxial growth from the tertiary lattice parameter accommodation layer formed in step j), the second tertiary active semiconductor portion being arranged on, and in contact with, the tertiary lattice parameter accommodation layer, step k) being performed at the same time and with the same technique as step c) and step g);

l) Formation of a third tertiary semiconductor portion intended to be electrically connected to a second electrode and doped according to a second doping type opposite to the first doping type, at least on, and in contact with, the second semiconductor portion tertiary active;

the second tertiary active semiconductor portion formed in step k) being configured so as to emit said third light radiation when at least one of the first and second electrodes is powered;

and wherein the tertiary lattice parameter accommodation layer formed in step j) has, at least at its interface with the second tertiary active semiconductor portion formed in step k), a first difference in tertiary lattice parameters comprised between 4.39% and 1.21% relative to the second secondary active semiconductor portion.

21. The manufacturing method according to claim 19, wherein step j) includes at least one of the following sub-steps:

j1) formation of at least one lattice parameter accommodation tertiary sub-layer of a first nature configured so that the third light radiation capable of being emitted by the second tertiary active semiconductor portion formed in step k) on, and in contact with, said lattice parameter accommodation tertiary sub-layer of a first nature is generally blue-colored by comprising light rays having wavelengths comprised between the first minimum value equal to 440 nm and the first maximum value equal to 500 nm, the lattice parameter accommodation tertiary sub-layer of a first nature being similar in composition and in thickness to the lattice parameter accommodation primary sub-layer of a first nature and to the lattice parameter accommodation secondary sub-layer of a first nature and step j1) being carried out at the same time and by the same technique as step b1) and as step f1);

j2) formation of a lattice parameter accommodation tertiary sub-layer of a second nature configured so that the third light radiation capable of being emitted by the second tertiary active semiconductor portion formed in step k) on, and in contact with, said lattice parameter accommodation tertiary sub-layer of a second nature is generally green-colored by comprising light rays having wavelengths comprised between the second minimum value equal to 500 nm and the second maximum value equal to 570 nm, the lattice parameter accommodation tertiary sub-layer of a second nature being similar in composition and in thickness to the lattice parameter accommodation primary sub-layer of a second nature and to the lattice parameter accommodation secondary sub-layer of a second nature and step j2) being carried out at the same time and by the same technique as step b2) and as step f2);

j3) formation of at least one lattice parameter accommodation tertiary sub-layer of a third nature configured so that the third light radiation capable of being emitted by the second tertiary active semiconductor portion formed in step k) on, and in contact with, said lattice parameter accommodation tertiary sub-layer of a third nature is generally red-colored by comprising light rays having wavelengths comprised between the third minimum value equal to 570 nm and the third maximum value equal to 680 nm, the lattice parameter accommodation tertiary sub-layer of a third nature is similar in composition and in thickness to the lattice parameter accommodation primary sub-layer of a third nature and to the lattice parameter accommodation secondary sub-layer of a third nature and step j3) is carried out at the same time and by the same technique as step b3) and as step f3).

22. An optoelectronic device comprising a primary sub-pixel including at least one primary light-emitting diode formed on a support face of a substrate and a secondary sub-pixel including at least one secondary light-emitting diode formed on the support face, wherein:
the primary light-emitting diode comprises:
  a first primary semiconductor portion having a general wired shape doped according to a first doping type, the first primary semiconductor portion extending from the support face;
  a primary lattice parameter accommodation layer arranged at least on, and in contact with, a top end and lateral surfaces of the first primary semiconductor portion;
  a second primary active semiconductor portion formed by epitaxial growth from the primary lattice parameter accommodation layer;
  a third primary semiconductor portion doped according to a second doping type opposite to the first doping type and arranged on, and in contact with, the second primary active semiconductor portion;
the secondary light-emitting diode comprises:
  a first secondary semiconductor portion having a general wired shape doped according to a first doping type, the first secondary semiconductor portion extending from the support face;
  a secondary lattice parameter accommodation layer arranged at least on, and in contact with, a top end and lateral surfaces of the first secondary semiconductor portion;
  a second secondary active semiconductor portion formed by epitaxial growth from the secondary lattice parameter accommodation layer;
  a third secondary semiconductor portion doped according to a second doping type opposite to the first doping type and arranged on, and in contact with, the second secondary active semiconductor portion;
  wherein each of the primary lattice parameter accommodation layer and the secondary lattice parameter accommodation layer comprises a stack of at least first and second sublayers successively arranged from respectively the first primary semiconductor portion and the first secondary semiconductor portion, the second primary active semiconductor portion being in contact with the first sublayer of the primary lattice parameter accommodation layer, the second secondary active semiconductor portion being in contact with the second sublayer of the secondary lattice parameter accommodation layer.

23. The optoelectronic device according to claim 22 further comprising: a tertiary sub-pixel including at least one tertiary light-emitting diode formed on the support face of the substrate, wherein:
the tertiary light-emitting diode comprises:
  a first tertiary semiconductor portion having a general wired shape doped according to a first doping type, the first tertiary semiconductor portion extending from the support face;
  a tertiary lattice parameter accommodation layer arranged at least on, and in contact with, the top end and the lateral surfaces of the first tertiary semiconductor portion;
  a second tertiary active semiconductor portion formed by epitaxial growth from the tertiary lattice parameter accommodation layer;
  a third tertiary semiconductor portion doped according to a second doping type opposite to the first doping type and arranged on, and in contact with, the second tertiary active semiconductor portion;
  wherein the tertiary lattice parameter accommodation layer comprises a stack of first, second and third sublayers successively arranged from the first tertiary semiconductor portion, the second tertiary active semiconductor portion being in contact with the third sublayer of the tertiary lattice parameter accommodation layer.

24. A method for manufacturing an optoelectronic device comprising a primary sub-pixel including at least one primary light-emitting diode formed on a support face of a substrate and a secondary sub-pixel including at least one secondary light-emitting diode formed on the support face of the substrate, the method including the following steps:
forming semiconductor portions on the support face including a first primary semiconductor portion and a first secondary semiconductor portion having each a general wired shape doped according to a first doping type and extending each from the support face;
forming lattice accommodation layers comprising primary and secondary lattice parameter accommodation layers respectively on the first primary semiconductor portion and on the first secondary semiconductor portion, the step of forming the lattice accommodation layers comprising:
  stacking at least a first and a second sublayers successively on at least a top end of the first primary semiconductor portion and the first secondary semiconductor portion;
  selectively removing at least the top end of the second sublayer at the level of the first primary semiconductor portion so that the primary lattice parameter accommodation layer having the top end of the first sublayer exposed thereon;
  forming a second primary active semiconductor portion by epitaxial growth at least from the exposed first sublayer of the primary lattice parameter accommodation layer formed on the first primary semiconductor portion;
  forming a second secondary active semiconductor portion by epitaxial growth from the secondary lattice parameter accommodation layer having a stack of the first and second sublayers at the top of the first secondary semiconductor portion.

25. The method for manufacturing the optoelectronic device according to claim 24, wherein:
the optoelectronic device comprises a tertiary sub-pixel including at least one tertiary light-emitting diode formed on the support face of the substrate,
a first tertiary semiconductor portion having a general wired shape doped according to a first doping type and extending from the support face formed in the step of forming semiconductor portions, and a third sublayer is formed on the second sublayers in the step of forming the lattice parameter accommodation layers in order to form a tertiary lattice parameter accommodation layer on the first tertiary semiconductor portion, the step of forming the lattice parameter accommodation layers comprising:

selectively removing at least the top end of the third sublayer at the level of the first primary semiconductor portion before selectively removing at least the top end of the second sublayer at the level of the first primary semiconductor portion;

selectively removing at least the top end of the third sublayer at the level of the first secondary semiconductor portion before implementing the step of forming a second secondary active semiconductor portion;

forming a second tertiary active semiconductor portion by epitaxial growth from the tertiary lattice parameter accommodation layer having the stack of the first, second and third sublayers at the top of the first tertiary semiconductor portion.

* * * * *